United States Patent
Fujita et al.

(10) Patent No.: US 7,069,496 B2
(45) Date of Patent: Jun. 27, 2006

(54) DECODING METHOD, DECODING APPARATUS AND DIGITAL TRANSMISSION SYSTEM OF PRODUCT CODE

(75) Inventors: Hachiro Fujita, Tokyo (JP); Yoshikuni Miyata, Tokyo (JP); Takahiko Nakamura, Tokyo (JP); Hideo Yoshida, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 369 days.

(21) Appl. No.: 10/284,391

(22) Filed: Oct. 31, 2002

(65) Prior Publication Data

US 2003/0126546 A1  Jul. 3, 2003

(30) Foreign Application Priority Data

Jan. 31, 2002  (JP) ............................ 2002-024347

(51) Int. Cl.
    *H03M 13/00* (2006.01)
(52) U.S. Cl. ................. 714/780; 714/785; 714/755
(58) Field of Classification Search ................ 714/746, 714/780, 785, 755
    See application file for complete search history.

(56) References Cited

U.S. PATENT DOCUMENTS

| | | | |
|---|---|---|---|
| 5,563,897 A | 10/1996 | Pyndiah et al. | 714/755 |
| 6,065,147 A | 5/2000 | Pyndiah et al. | 714/755 |
| 6,611,939 B1 * | 8/2003 | Noguchi | 714/764 |
| 6,615,385 B1 * | 9/2003 | Kim et al. | 714/758 |
| 6,671,852 B1 * | 12/2003 | Ariel et al. | 714/793 |
| 6,763,494 B1 * | 7/2004 | Hewitt | 714/780 |

FOREIGN PATENT DOCUMENTS

JP  07-202722 A  8/1995

OTHER PUBLICATIONS

Goalic, Andre et al.; "Real-Time Turbo-Decoding of Product Codes On A Digital Signal Processor"; IEEE Global Telecommunications Conference, Globecom 97, Phoenix, AZ, Nov. 1997; pp. 624-628, XP010254690; ISBN: 0-7803-4198-8.

Pyndiah, R.; "Iterative decoding of product codes: block codes"; International Symposium on Turbo Codes & Related Topics, Brest, France, Sep. 1997, pp. 71-79, XP002287206.

(Continued)

*Primary Examiner*—Albert Decady
*Assistant Examiner*—Esaw Abraham
(74) *Attorney, Agent, or Firm*—Birch Stewart Kolasch & Birch LLP

(57) ABSTRACT

A decoding apparatus generates error position sets of data sequence by generating a codeword from positions of soft input values output from a low reliability position detecting circuit and from syndromes computed by a syndrome calculation circuit. The recording apparatus further includes a codeword candidate generating circuit that computes correlation mismatch amounts by adding soft input values at the error positions contained in the error position sets, and updates the correction information according to the error position sets and correlation mismatch amounts. The decoding apparatus can calculate the soft output values accurately by utilizing the generated codeword candidates efficiently, and reduce the circuit scale by decreasing the amount of computation.

16 Claims, 11 Drawing Sheets

OTHER PUBLICATIONS

Kerouedan, Sylvie et al.; "How we implemented block turbo codes?"; Annales des Telecommunications—of Telecommunications, Presses Polytechniques et Universitaires Romandes, Lausanne, Ch; vol. 56, No. 7/8, Jul. 2001, pp. 447-454, XP001100324, ISSN; 00034347.

International Telecommunications Union (ITU); "ITU-T G.975 Forward Error Correction for Submarine Systems"; ITU-T Recommendation G.975, Oct. 2000, pp. 1-24, XP002248444.

AIT SAB, Omar et al.; "Block Turbo Code Performances For Long-Haul DWDM Optical Transmission Systems"; Optical Fiber Communication Conference, OFC 2000, Technical Digest Post Conference Edition, Baltimore, MD; vol. 3 of 4, Mar. 2000, pp. THS5-1-THS5-3, XP001036038, ISBN: 0-7803-5952-6.

Dave, Sameep et al.; "An Efficient Decoding Algorithm for Block Turbo Codes"; IEEE Transactions on Communications, IEEE Inc., New York, NY; vol. 49, No. 1, Jan. 2001, pp. 41-46, XP002255647, ISSN: 0090-6778.

Shibutani, Akira et al.; Complexity Reduction of Turbo Decoding; Vehicular Technology Conference, 1999. VTC 1999—Fall. IEEE VTS 50th Amsterdam, Netherlands 19-22, Sep. 1999, Piscataway, NJ; pp. 1570-1574, XP010353321, ISBN: 0-7803-5435-4.

Argon, Cenk et al.; "Turbo Product Codes for Performance Improvement of Optical CDMA Systems"; IEEE Global Telecommunications Conference, Globecom '01, San Antonio, TX; vol. 3 of 6, Nov. 25, 2001, pp. 1505-1509, XP001054830, ISBN: 0-7803-7206-9.

Pyndiah, IEEE Transactions on Communications, vol. 46, No. 8, pp. 1003-1010 Aug. 1998.

* cited by examiner

US 7,069,496 B2

DECODING METHOD, DECODING APPARATUS AND DIGITAL TRANSMISSION SYSTEM OF PRODUCT CODE

BACKGROUND OF THE INVENTION

1. Field of the Invention

The present invention relates to a decoding method, decoding apparatus and digital transmission system of a product code for improving the reliability of a digital communication system or digital recording system.

2. Description of Related Art

Although error-correcting codes such as Reed-Solomon codes have been utilized to improve reliability of digital communication/recording systems, more powerful error-correcting codes have been required recently to meet increasing speed and capacity of the systems.

In general, high performance correcting codes require complicated decoding, which makes it difficult to be built into an apparatus. However, using concatenated codes or product codes makes it possible to implement high-performance coding rather easily. In particular, the product codes have an advantage that they have large redundancy and error-correcting power because of the double encoding of information data. Accordingly, they are applied as an error-correcting method of CD-ROMs and DVDs.

FIG. 9 is a diagram showing a construction of a product code. In FIG. 9, a code in the vertical direction is a binary linear code C1 with a code length N1 and information length K1, and a code in the horizontal direction is a binary linear code C2 with a code length N2 and information length K2. The block 1 designates information data, and blocks 2–4 each designate checks (redundant checks).

Next, an encoding method of the product code will be described with reference to FIG. 9.

First, K1×K2-bit information data are stored in the two-dimensional array (block 1) with K1 rows and K2 columns. The block 1 is represented by the following Expression (1), where $D_{i,j}$ (i=1, 2, ..., K1; j=1, 2, ..., K2) is 0 or 1.

$$\begin{bmatrix} D_{1,1} & D_{1,2} & \cdots & D_{1,K2} \\ D_{2,1} & D_{2,2} & \cdots & D_{2,K2} \\ \vdots & \vdots & \ddots & \vdots \\ D_{K1,1} & D_{K1,2} & \cdots & D_{K1,K2} \end{bmatrix} (D_{i,j} = 0, 1) \quad (1)$$

Next, individual columns from the first to K2th column are provided with (N1−K1)-bit checks of the C1 code to construct a two-dimensional array with N1-rows and K2-columns (construction of the block 2). Subsequently, individual rows from the first to N1th row are provided with (N2−K2)-bit checks of the C2 code to construct a two-dimensional array with N1-rows and N2-columns (construction of the blocks 3 and 4).

FIG. 10 is a block diagram showing a configuration of a conventional digital transmission system utilizing a product code, which is disclosed in Japanese patent application laid-open No. 7-202722, for example. In FIG. 10, the reference numeral 1 designates an encoder for encoding input information data to generate a product code; 2 designates a modulator for converting the product code generated by the encoder 1 into a signal suitable for a communication channel 3; 3 designates the communication channel; 4 designates a demodulator for demodulating a received signal sent via the communication channel 3 and for supplying the demodulated data to a decoder 5; and 5 designates the decoder for decoding the demodulated data supplied from the demodulator 4 to estimate the information data. The encoder 1 and modulator 2 constitute a transmitter, and the demodulator 4 and the decoder 5 constitute a receiver.

Next, the operation of the system as shown in FIG. 10 will be described.

The input K1×K2-bit information data are supplied to the encoder 1 for generating the product code with N1 rows and N2 columns. The product code generated is represented by a matrix C of the following Expression (2). Although the elements of the product code C is represented by the binary 0 or 1, the binary 0 is represented as "+1", and the binary 1 is represented by "−1" in the following.

$$C = \begin{bmatrix} C_{1,1} & C_{1,2} & \cdots & C_{1,N2} \\ C_{2,1} & C_{2,2} & \cdots & C_{2,N2} \\ \vdots & \vdots & \ddots & \vdots \\ C_{N1,1} & C_{N1,2} & \cdots & C_{N1,N2} \end{bmatrix} (C_{i,j} = \pm 1) \quad (2)$$

The product code generated by the encoder 1 is supplied to the modulator 2 to be converted into the signal suitable for the communication channel 3, and is transmitted through the communication channel 3. It is assumed as to the communication channel 3 that additive noise is superimposed on a transmission signal. The signal received through the communication channel 3 is supplied to the demodulator 4 of the receiver.

The demodulator 4 carries out shaping of the received signal to generate the demodulated data Y given by the following Expression (3). The components of the matrix Y are represented as $Y_{i,j}=C_{i,j}+N_{i,j}$, where $N_{i,j}$ are noise components. The demodulated data Y generated by the demodulator 4 is supplied to the decoder 5 for estimating the transmitted information data.

$$Y = \begin{bmatrix} Y_{1,1} & Y_{1,2} & \cdots & Y_{1,N2} \\ Y_{2,1} & Y_{2,2} & \cdots & Y_{2,N2} \\ \vdots & \vdots & \ddots & \vdots \\ Y_{N1,1} & Y_{N1,2} & \cdots & Y_{N1,N2} \end{bmatrix} \quad (3)$$

In the following description, a matrix is represented by braces such as {Y} and a vector is represented by square brackets such as [V]. Thus, the demodulated data Y of the foregoing Expression (3) is denoted by {Y}, and is referred to as an input matrix. The first column (N1 vector) is denoted by $[V_{k,1}]$, and to specify the range of the suffix k, it is represented as $[V_{k,1}]$ (k=1, 2, ..., N1).

FIG. 11 is a flowchart illustrating the operation of the decoder 5. In FIG. 11, ST1 is a step of inputting the input matrix {Y}; ST2 is a step of setting initial values into a correction matrix {W} and a decision matrix {D}; ST3 is a step of setting an initial value into a counter j; ST4 is a step of calculating a soft input vector $[R_k]$(k=1, 2, ..., N1); ST5 is a step of calculating a soft output vector $[L_k]$ (k=1, 2, ..., N1); ST6 is a step of updating a correction matrix {W}; ST7 is a step of comparing the value of the counter j; and ST8 is a step of incrementing the value of the counter j.

In addition, ST9 is a step of setting an initial value into a counter i; ST10 is a step of calculating a soft input vector $[R_k]$ (k=1, 2, ..., N2); ST11 is a step of calculating a soft output vector $[L_k]$(k=1, 2, ..., N2); ST12 is a step of updating the correction matrix {W}; ST13 is a step of comparing the value of the counter i; ST14 is a step of incrementing the value of the counter i; ST15 is a step of making a decision as to whether to iterate the decoding of the product code; and ST16 is a step of outputting the decision matrix {D}.

Next, the operation of the decoder 5 will be described in more detail with reference to the flowchart of FIG. 11. First, at step ST1, the N1×N2 input matrix {Y} given by the foregoing Expression (3) is input. At the next step ST2, the initial value zero is stored into all the elements of the N1×N2 correction matrix {W} given by the following Expression (4).

$$W = \begin{bmatrix} W_{1,1} & W_{1,2} & \cdots & W_{1,N2} \\ W_{2,1} & W_{2,2} & \cdots & W_{2,N2} \\ \vdots & \vdots & \ddots & \vdots \\ W_{N1,1} & W_{N1,2} & \cdots & W_{N1,N2} \end{bmatrix} \quad (4)$$

Furthermore, initial values sgn{Y} are stored into all the elements of the N1×N2 decision matrix {D}. Specifically, the (i,j) elements $D_{i,j}$ of the decision matrix {D} is replaced by the code $sgn(Y_{i,j})$ of the (i,j) elements $Y_{i,j}$ of the input matrix {Y}, where sgn is a function defined by the following Expression (5).

$$\text{sgn}(x) = \begin{cases} +1 & (x \geq 0) \\ -1 & (x < 0) \end{cases} \quad (5)$$

At step ST3, the initial value one is set into the counter j. At the next step ST4, decoding of the C1 code is started.

At step ST4, jth column of the input matrix {Y} and the jth column of the correction matrix {W} are added element by element. Specifically, according to the following Expression (6), the (k,j) elements $Y_{k,j}$ of the input matrix {Y} are added to the (k,j) elements $W_{k,j}$ of the correction matrix {W} to calculate the soft input values $R_k$ (k=1, 2, ..., N1).

$$R_k \leftarrow Y_{k,j} + \alpha \times W_{k,j} (k=1, 2, \ldots, N1) \quad (6)$$

where α is an appropriate normalizing constant.

In the following description, the jth column of the input matrix is denoted by $[Y_{k,j}]$, that of the decision matrix is denoted by $[D_{k,j}]$, and that of the correction matrix is denoted by $[W_{k,j}]$, which are called input vector, decision vector and correction vector, respectively, according to the foregoing Japanese patent application laid-open No. 7-202722.

At step ST5, the decision vector $[D_{k,j}]$ is updated and the soft output vector $[L_k]$ (k=1, 2, ..., N1) is calculated. The details of step ST5 will be described later.

At step ST6, the differences obtained by subtracting the soft input vector from the soft output vector calculated at step ST5 are stored in the jth column of the correction matrix {W} according to the following Expression (7).

$$W_{k,j} \leftarrow L_k - R_k (k=1, 2, \ldots, N1) \quad (7)$$

At the next step ST7, a decision is made as to whether the value of the counter j is less than N2. If it is less than N2, the value of the counter j is incremented at step ST8, followed by iterating the processing from step ST4 and on. On the other hand, if the value of the counter j is N2, the processing proceeds to step ST9, at which the decoding of the C2 code is started. Up to this time, the update of all the elements of the correction matrix {W} has been completed.

At step ST9, the initial value one is set into the counter i, and the processing proceeds to step ST10. At the next step ST10, ith row of the input matrix {Y} and the ith row of the correction matrix {W} are added element by element. Specifically, according to the following Expression (8), the (i,k) elements $Y_{i,k}$ of the input matrix are added to the (i,k) elements $W_{i,k}$ of the correction matrix to calculate the soft input values $R_k$(k=1, 2, ..., N2).

$$R_k \leftarrow Y_{i,k} + \alpha \times W_{i,k} (k=1, 2, \ldots, N2) \quad (8)$$

where α is an appropriate normalizing constant.

In the following description, the ith row of the input matrix is denoted by $[Y_{i,k}]$ that of the decision matrix is denoted by $[D_{i,k}]$, and that of the correction matrix is denoted by $[W_{i,k}]$, which are called input vector, decision vector and correction vector, respectively, as in the decoding of the foregoing C1 code.

At step ST11, the decision vector $[D_{i,k}]$ is updated and the soft output vector $[L_k]$ (k=1, 2, ..., N2) is calculated. The details of step ST11 will be described later.

At step ST12, the differences obtained by subtracting the soft input vector from the soft output vector calculated at step ST11 are stored in the ith rows of the correction matrix {W} according to the following Expression (9).

$$W_{i,k} \leftarrow L_k - R_k (k=1, 2, \ldots, N2) \quad (9)$$

At the next step ST13, a decision is made as to whether the value of the counter i is less than N1 or not. If it is less than N1, the value of the counter i is incremented at step ST14, followed by iterating the processing from step ST10 and on. On the other hand, if the value of the counter i is N1, the processing proceeds to step ST15. Up to this time, the decoding of the C1 code and C2 code constituting the product code has been completed once.

At step ST15, a decision is made as to whether the decoding of the C1 code is iterated or not. Usually, the decoding is completed when the decoding has been iterated by a predetermined number of times. To iterate the decoding of the C1 code, the processing proceeds to step ST3 to restart the decoding of the C1 code. On the other hand, to stop the decoding, the processing proceeds to step 16, at which the decision matrix {D} is output. Thus, the decoding processing is completed.

The data $D_{i,j}$ (i=1, 2, ..., K1; j=1, 2, ..., K2) stored in the K1×K2 decision matrix {D} output at step 16 represent the information data estimated by the decoding. Although the elements of the decision matrix {D} take a value "±1", the value "+1" corresponds to a binary zero, and "−1" corresponds to a binary one.

Next, the soft input/soft output decoding of the C1 code at step ST5 will be described. FIG. 12 is a flowchart illustrating the details of step ST5.

At step ST21, the soft input vector $[R_k]$ and the decision vector $[D_k]$ are input.

At step ST22, p elements with least absolute values are selected from the soft input vector $[R_k]$. The positions of the p elements are denoted by k1, k2, ..., and kp.

At step ST23, a test vector $[T_k]$ is generated whose elements $T_{km}$=0 or 1 at the p positions km (m=1, 2, ..., p) selected at step ST22, with the remaining elements $T_k$=0 (k≠km). Since the total of q=$2^P$ test vectors are present, they are denoted as $[T^s]$ (s=1, 2, ..., q) using the suffix s. The resultant test vectors $[T^s]$ and the decision vector $[D_k]$ are added element by element to generate words $[U^s]$ given by the following Expression (10) for carrying out algebraic decoding of the C1 code. In Expression (10), the elements "+1" and "−1" of the decision vector $[D_k]$ is converted to a binary zero and one, respectively, and are subjected to modulo-2 addition.

$$[U^s]=[D_k]+[T^s] (s=1, 2, \ldots, q) \qquad (10)$$

At step ST24, r different candidate codewords $[C^t]=(C^t_1, C^t_2, \ldots, C^t_{N1})$ (t=1, 2, ..., r) are generated by applying the algebraic decoding of the C1 code to the q words $[U^s]$ (s=1, 2, ..., q) generated at step ST23.

At step ST25, squared Euclidean distances $M^t$ (t=1, 2, ..., r) are calculated between the soft input vector $[R_k]$ and the candidate codewords $[C^t]$. The squared Euclidean distance $M^t$ between the soft input vector $[R^k]$ and the candidate codewords $[C^t]$ are given by the following Expression (11).

$$M^t = \sum_{k=1}^{N1} (R_k = C^t_k)^2 \qquad (11)$$

At step ST26, the codeword $[C^d]$ that gives the minimum squared Euclidean distance, that is, the codeword $[C^d]$ that satisfies the relationship $M^t \geq M^d$ (t=1, 2, ..., r) is selected. In addition, the codeword $[C^d]$ is substituted into the decision vector according to the following Expression (12).

$$[D] \leftarrow [Cd] \qquad (12)$$

At step ST27, the counter k is set at its initial value one, and the processing proceeds to step ST28. At step ST28, a decision is made as to whether any candidate codeword $[C^t]$ (t=1, 2, ..., r) is present, the kth value $C^t_k$ of which differs from the kth value $C^d_k$ of the codeword $[C^d]$ selected at step ST26, that is, whether the codeword $[C^t]$ that satisfies $C_{tk}=-C^d_k$ is present or not. If it is not present, the processing proceeds to step ST29. If it is present, the processing proceeds to step ST30 at which a codeword that gives the least squared Euclidean distance among such codewords, which is called a concurrent codeword and denoted by $[C^c]$, is selected, and the processing proceeds to step ST31. At step ST29, the soft output values given by the following Expression (13) are calculated.

$$L_k \leftarrow \beta C^d_k \qquad (13)$$

where β is an appropriate normalizing value.

At step ST31, the soft output values given by the following Expression (14) are calculated.

$$L_k \leftarrow ((M^c-M^d)/4) C^d_k \qquad (14)$$

where $M^c$ is a squared Euclidean distance between the concurrent codeword $[C^c]$ and the soft input vector $[R_k]$.

At step ST32, a decision is made as to whether the value of the counter k is less than N1 or not. If k is less than N1, the processing proceeds to step ST33, at which the value of the counter k is incremented by one to iterate the processing from step ST28 and on. On the other hand, if k is equal to N1, the processing proceeds to step ST34, at which the soft output vector $[L_k]$ and the decision vector $[D_k]$ are output, followed by completing the entire processing.

Thus, the soft input/soft output decoding of the C1 code at step ST5 has been completed. Since the soft input/soft output decoding of the C2 code at step ST11 is the same as that of the C1 code, the description thereof is omitted here.

As seen from the foregoing Expressions (13) and (14), the conventional soft output values are calculated using at most two codewords among the candidate codewords generated at step ST24.

With the foregoing configuration, the conventional decoding method of a product code has a problem of being unable to reflect the information provided by the candidate codewords other than the codeword $[C^d]$ and the concurrent codeword $[C^c]$ closest to the soft input vectors in terms of the squared Euclidean distance among the many codewords found at the codeword generating step, thereby being unable to calculate the soft output values accurately.

In addition, it is necessary for the soft output calculation in Expression (14) to calculate the squared Euclidean distances $M^d$ and $M^c$ between the soft input vector $[R^k]$ and the candidate codeword $[C^d]$ and the concurrent codeword $[C^c]$. The amount of calculation of the squared Euclidean distance, however, is large, and this presents a problem of increasing the circuit scale when implementing the calculation by hardware.

Furthermore, since the foregoing decoding method is developed with only the floating-point operation in mind, it has a problem of being unsuitable for the fixed-point operation. In particular, when the demodulation data are represented in terms of the hard decision values and their reliability information, it is necessary to develop a decoding method and a decoding apparatus applicable to them.

SUMMARY OF THE INVENTION

The present invention is implemented to solve the foregoing problems. It is therefore an object of the present invention to provide a decoding method, decoding apparatus and digital transmission system of a product code capable of calculating the soft output values accurately by efficiently utilizing the candidate codewords generated, and capable of reducing the circuit scale by reducing the amount of operation.

According to a first aspect of the present invention, there is provided a decoding method including the steps of generating a codeword from positions of soft input values detected by a detection step and the syndromes computed by a syndrome calculation step to generate error position sets of a data sequence, and calculating correlation mismatch amounts by adding the soft input values at the error positions included in the error position sets of the data sequence; and updating correction information in accordance with the error position sets and the correlation mismatch amounts. Thus, the decoding method offers an advantage of being able to calculate the soft output values accurately by utilizing the generated codeword candidates efficiently, and to reduce the calculation amount and the circuit scale.

According to a second aspect of the present invention, there is provided a decoding apparatus including: C1 code decoding means for receiving correction information and demodulation data multiplexed by multiplexing means, for updating the correction information by carrying out soft input/soft output decoding of the C1 code, and for decoding a binary linear code from the updated correction information and the demodulation data. Thus, the decoding apparatus offers an advantage of being able to calculate the soft output values accurately by utilizing the generated codeword candidates efficiently, and to reduce the calculation amount and the circuit scale.

According to a third aspect of the present invention, there is provided a digital transmission system having a decoding apparatus including: C1 code decoding means for receiving correction information and demodulation data multiplexed by multiplexing means, for updating the correction information by carrying out soft input/soft output decoding of the C1 code, and for decoding a binary linear code from the updated correction information and the demodulation data. Thus, the digital transmission system offers an advantage of being able to construct a highly reliable digital transmission system.

DETAILED DESCRIPTION OF THE PREFERRED EMBODIMENTS

The invention will now be described with reference to the accompanying drawings.

Embodiment 1

Figure 1:
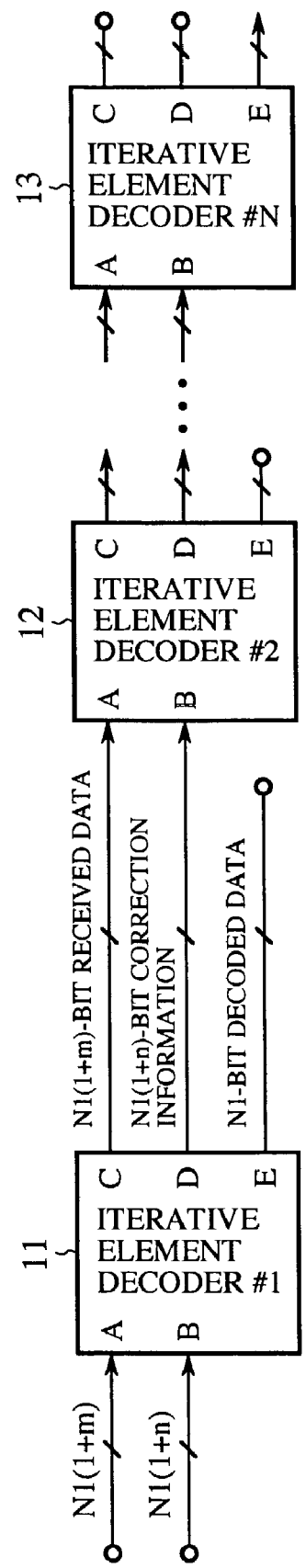
FIG. 1 is a block diagram showing a configuration of a decoding apparatus of a product code of an embodiment 1 in accordance with the present invention.

FIG. 1 is a block diagram showing a configuration of a decoding apparatus of a product code of an embodiment 1 in accordance with the present invention. In FIG. 1, reference numerals 11, 12 and 13 each designate an iterative element decoder of a product code. An input terminal A of each of the iterative element decoders 11, 12 and 13 is provided for inputting demodulation data; an input terminal B is provided for inputting correction information used for decoding; an output terminal C is provided for outputting demodulation data which is supplied from the terminal A and undergoes the decoding; an output terminal D is provided for outputting updated correction information; and an output terminal E is provided for outputting the decoded data.

Next, the operation will be described.

Here, the description is made using a product code under the assumption that both C1 code and C2 code are a Hamming code, and the parity check matrix of the C1 code is H1, and that of the C2 code is H2. The parity check matrix H1 is given by the following Expression (15) using an appropriate primitive element a of a Galois field.

Likewise, the parity check matrix H2 is given by the following Expression (16) using an appropriate primitive element β of the Galois field. It is further assumed that the N1×N2 product code is transmitted column by column (in such a manner that N1 bits are sent in parallel) in the encoding direction of the C2 code.

$$H1=[1\alpha \ldots \alpha^{N1-2}\alpha^{N1-1}] \quad (15)$$

$$H2=[1\beta \ldots \beta^{N2-2}\beta^{N2-1}] \quad (16)$$

The input terminal A of the iterative element decoder 11 is supplied with the demodulation data of the product code column by column. The demodulation data of each transmitted bit consists of a 1-bit hard decision value and m-bit reliability information about the hard decision value. Accordingly, the total of N1(1+m)-bit data corresponding to each column is supplied to the input terminal A in parallel.

The input terminal B of the iterative element decoder 11 is supplied with the initial values of the correction information about the demodulation data column by column. The correction information for each transmitted bit consists of a 1-bit hard decision value and n-bit reliability information about the hard decision value. Accordingly, the total of N1(1+n)-bit data corresponding to N1-bit correction information for one column is supplied to the input terminal B in parallel. As the initial values of the correction information, the hard decision value is set at zero, and the reliability information is set at a least reliability value, zero, for example. Incidentally, although the bit width m of the reliability information on the demodulation data and the bit width n of the reliability information on the correction information can be set freely, it is assumed in the following description that n is greater than m.

The correction information indicates whether the demodulation data includes any error or not: When the hard decision of the correction information is one, it indicates that the hard decision of the demodulation data is incorrect; whereas when it is zero, it indicates that the hard decision of the demodulation data is correct. In addition, the reliability information of the correction information indicates the reliability about the hard decision value. For example, when the hard decision value is one and the reliability information is large, it is very likely that the hard decision of the demodulation data is incorrect. At the initial stage, it is assumed that the hard decision value of the correction information is zero, that is, the hard decision of the demodulation data is correct and its reliability information is set at a least value.

The demodulation data of the product code supplied to the input terminal A is output from the output terminal C of the iterative element decoder 11 column by column in the same order as the input, after the decoding in the iterative element decoder 11 has been completed. At the same time, the correction information updated by the iterative element decoder 11 is output from the output terminal D in parallel with the demodulation data. In addition, the decoded data of the product code estimated by the iterative element decoder 11 is output from the output terminal E column by column.

The input terminal A of the iterative element decoder 12 is supplied with the demodulation data of the product code output from the output terminal C of the iterative element decoder 11. The input terminal B thereof is supplied with the correction information output from the output terminal D of the iterative element decoder 11.

The demodulation data of the product code (the hard decision value and reliability information) supplied to the input terminal A of the iterative element decoder 12 is output from the output terminal C of the iterative element decoder 12 column by column in the same order as the input, after the decoding in the iterative element decoder 12 has been completed. At the same time, the correction information updated by the iterative element decoder 12 is output from its output terminal D in parallel with the demodulation data. In addition, the decoded data of the product code estimated by the iterative element decoder 12 is output from the output terminal E.

Likewise, the demodulation data of the product code (the hard decision value and reliability information) and the correction information updated by the iterative element decoder are supplied to the next iterative element decoder so that the correction information and the decoded data are updated again. Thus, the reliability of the decoded data is improved from update to update, and the decoded data of the final iterative element decoder is output as an estimate of the transmitted data.

Figure 2:
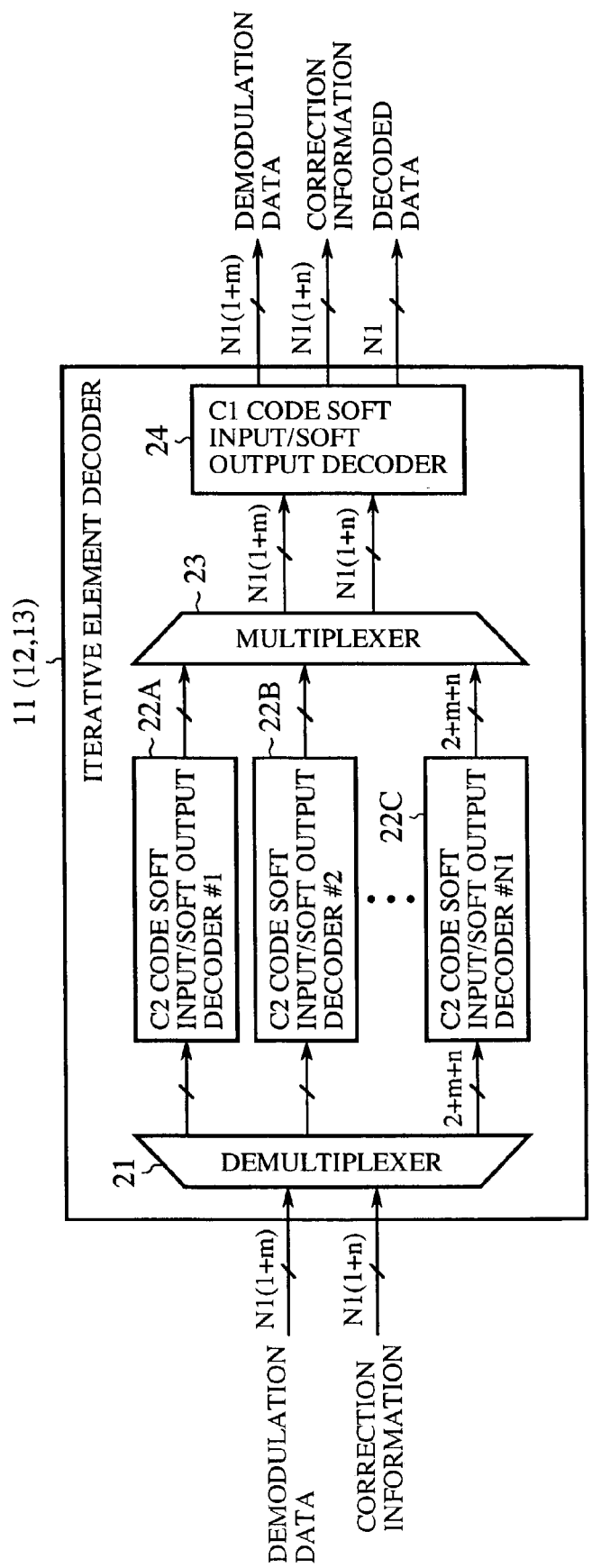
FIG. 2 is a block diagram showing a configuration of a iterative element decoder.

FIG. 2 is a block diagram showing a configuration of the iterative element decoder 11, 12 or 13. In FIG. 2, the reference numeral 21 designates a demultiplexer for demultiplexing the product code of each column into the demodulation data and correction information, and for supplying them to N1 C2 code soft input/soft output decoders 22A, 22B and 22C; and 22A, 22B and 22C each designate the C2 code soft input/soft output decoder that receives the C2 code demodulation data and correction information demultiplexed by the demultiplexer 21, updates the correction information by carrying out the soft input/soft output decoding of the C2 code, and outputs the updated correction information and the demodulation data.

The reference numeral 23 designates a multiplexer for multiplexing the demodulation data and correction information of the C2 code output from the N1 soft input/soft output decoders 22A, 22B and 22C of the C2 code. The reference numeral 24 designates a soft input/soft output decoder of the C1 code that receives the correction information and demodulation data multiplexed by the multiplexer 23, updates the correction information by carrying out the soft input/soft output decoding of the C1 code, and decodes the binary linear code from the updated correction information and the demodulation data.

Next, the operation of the iterative element decoder will be described in more detail.

The demultiplexer 21 demultiplexes the N1(1+m)-bit demodulation data and the N1 (1+n)-bit correction information corresponding to one column of the product code, which are supplied to the input terminal A of the iterative element decoder, into the N1 C2 codes each consisting of the (1+m)-bit demodulation data and (1+n)-bit correction information, and supplies them to the corresponding soft input/ soft output decoders of the C2 codes. Thus, every time the demodulation data is supplied to the input terminal A, the N1 soft input/soft output decoders of the C2 code are supplied with the total of (2+m+n)-bit data consisting of the (1+m)-bit demodulation data and the (1+n)-bit correction information.

Next, the configuration and operation of the soft input/soft output decoders 22A, 22B and 22C of the C2 code will be described. Since the N1 soft input/soft output decoders 22A, 22B and 22C of the C2 code have the same configuration, only the configuration and operation of the soft input/soft output decoder 22A will be described.

The soft input/soft output decoder 22A of the C2 code is supplied with the demodulation data and correction information corresponding to the first row of the product code given by the foregoing Expression (2). Let us assume that the kth (k=1, 2, . . . , N2) hard decision of the demodulation data values is denoted by $Y_k$, where $Y_k$ is zero or one, and its reliability information is denoted by $Z_k$, where $Z_k$ is an m-bit positive integer, and that the kth hard decision value of the correction information is denoted by $V_k$, where $V_k$ is zero or one, and its reliability information is denoted by $W_k$, where $W_k$ is denoted by an n-bit positive integer. The soft input/soft output decoder 22A of the C2 code is supplied with the hard decision values and reliability information of the demodulation data, and the hard decision values and reliability information of the correction information.

Figure 3:
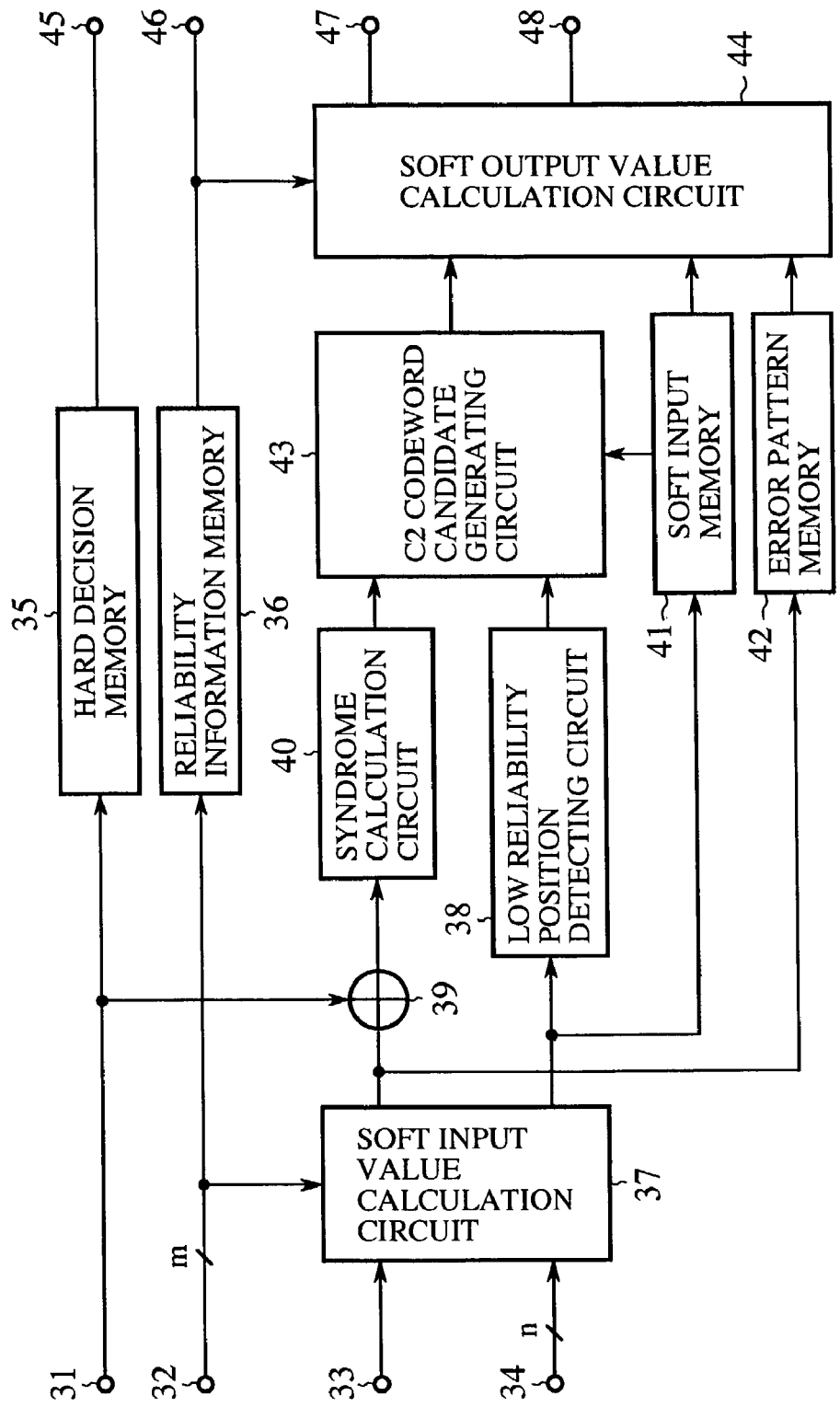
FIG. 3 is a block diagram showing a configuration of a soft input/soft output decoder of C2 code.

FIG. 3 is a block diagram showing a configuration of the soft input/soft output decoder 22A of the C2 code. In FIG. 3, the reference numeral 31 designates an input terminal for inputting the 1-bit hard decision values of the demodulation data; 32 designates an input terminal for inputting the m-bit reliability information of the demodulation data; 33 designates an input terminal for inputting the 1-bit hard decision values of the correction information; 34 designates an input terminal for inputting the n-bit reliability information of the correction information; 35 designates a memory for delaying the hard decision values of the demodulation data; and 36 designates a memory for delaying the reliability information of the demodulation data.

The reference numeral 37 designates a soft input value calculation circuit for calculating an error pattern and soft input value from the reliability information of the demodulation data and the hard decision value and reliability information of the correction information; 38 designates a low reliability position detecting circuit for detecting, when the soft input value calculation circuit 37 calculates the soft input values, p soft input values with least values, and for outputting the positions of those soft input values; 39 designates an adder for summing the error patterns computed by the soft input value calculation circuit 37 and the hard decision values of the demodulation data supplied from the input terminal 31 to generate a data sequence; 40 designates a syndrome calculation circuit for calculating the syndromes of the data sequence generated by the adder 39; 41 designates a memory for delaying the soft input values computed by the soft input value calculation circuit 37; and 42 designates a memory for delaying the error patterns computed by the soft input value calculation circuit 37.

The reference numeral 43 designates a C2 codeword candidate generating circuit. It generates error position sets of the data sequence by generating a codeword from the positions of the soft input values output from the low reliability position detecting circuit 38 and the syndromes computed by the syndrome calculation circuit 40. In addition, it calculates a correlation mismatch amount by adding the error position set of the data sequence and the soft input value at the error position in the error position set. The reference numeral 44 designates a soft output value calculation circuit for updating the hard decision value and reliability information of the correction information according to the reliability information of the demodulation data stored in the reliability information memory 36, the soft input values stored in the soft input memory 41, and the error patterns stored in the error pattern memory 42.

The reference numeral 45 designates an output terminal for outputting the 1-bit hard decision values of the demodulation data; 46 designates an output terminal for outputting the m-bit reliability information of the demodulation data; 47 designates an output terminal for outputting the 1-bit hard decision values of the correction information computed by the soft output value calculation circuit 44; and 48 designates an output terminal for outputting the n-bit reliability information of the correction information computed by the soft output value calculation circuit 44.

Figure 5:
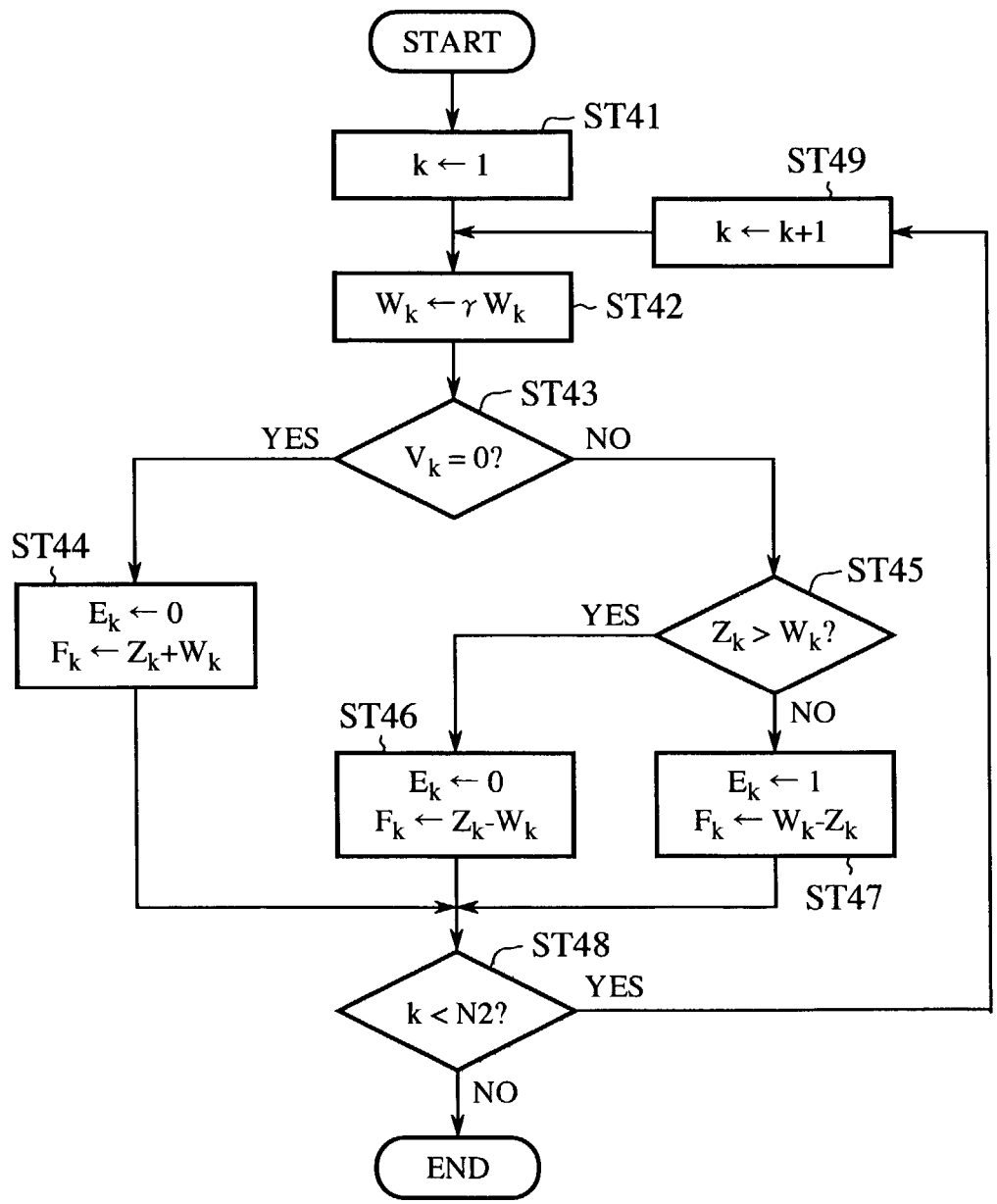
FIG. 5 is a flowchart illustrating the operation of a soft input value calculation circuit.
Figure 6:
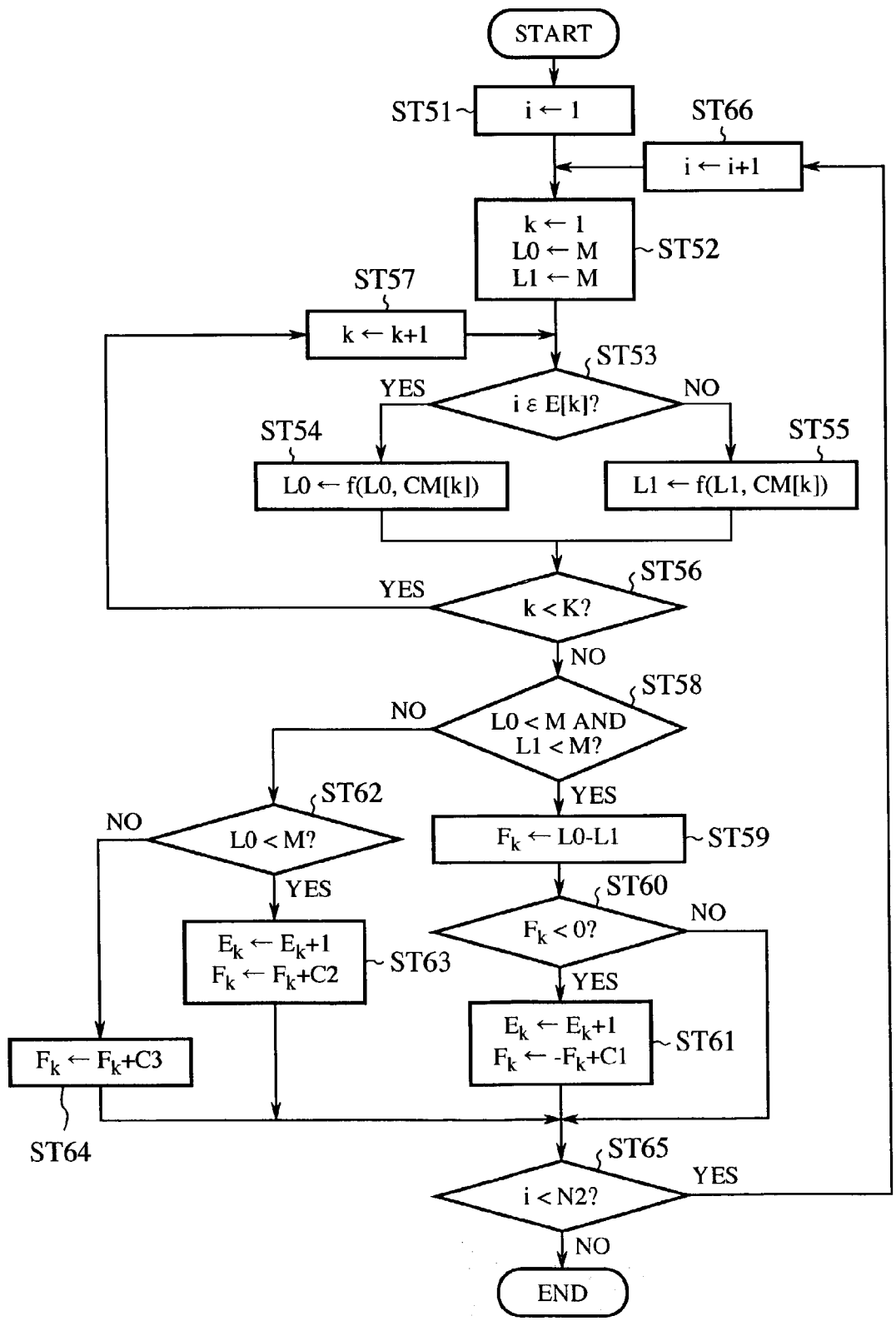
FIG. 6 is a flowchart illustrating the operation of a soft output value calculation circuit.
Figure 7:
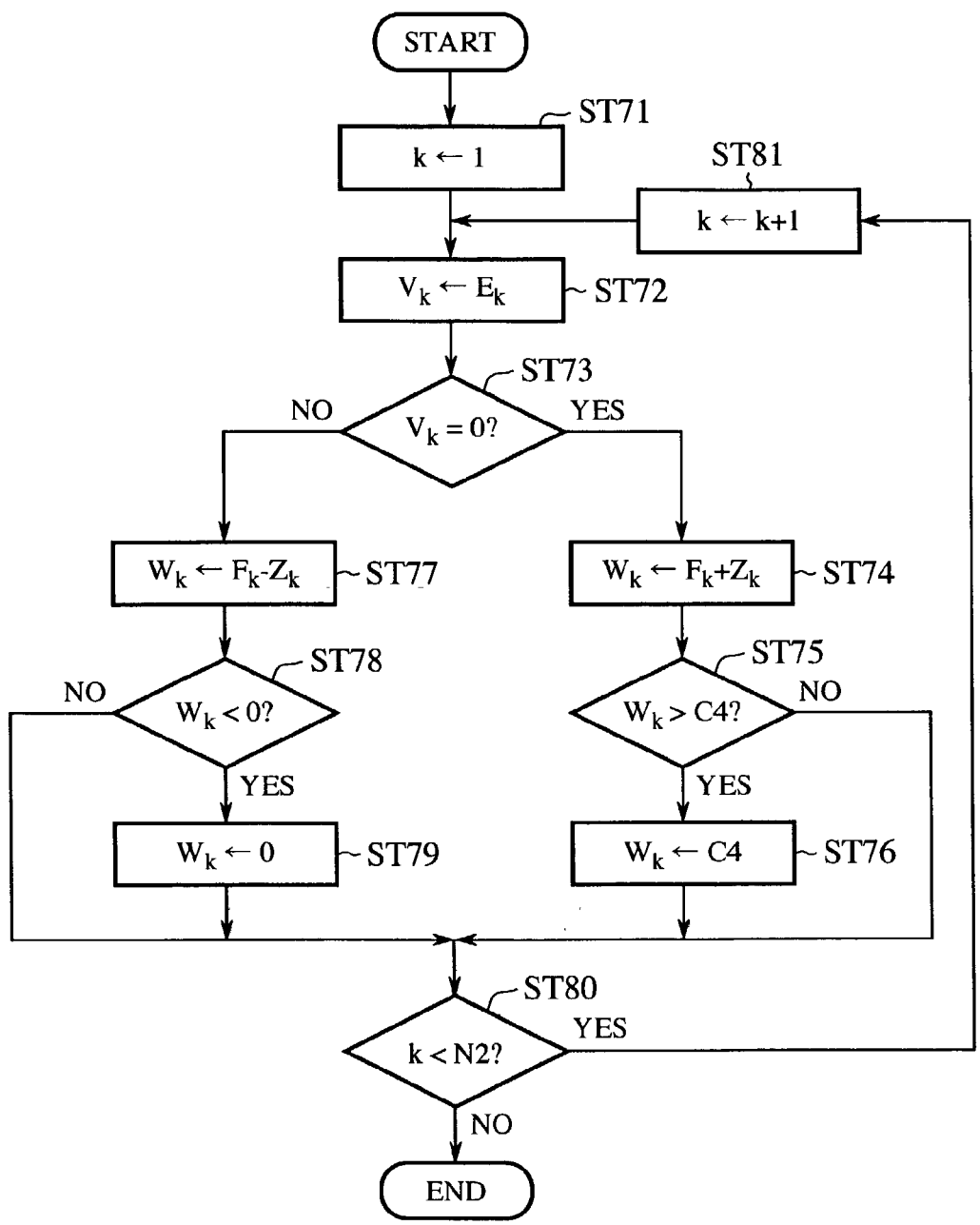
FIG. 7 is a flowchart illustrating an update method of correction information in the soft output value calculation circuit.

FIG. 5 is a flowchart illustrating the operation of the soft input value calculation circuit 37; FIG. 6 is a flowchart illustrating the operation of the soft output value calculation circuit 44; and FIG. 7 is a flowchart illustrating the update method of the correction information by the soft output value calculation circuit 44.

The hard decision values of the demodulation data supplied to the input terminal 31 are delivered to the adder 39 and are stored in the hard decision memory 35. At the same time, the reliability information of the demodulation data is supplied to the soft input value calculation circuit 37 and is stored in the reliability information memory 36.

In addition, the hard decision values and reliability information of the correction information supplied to the input terminals 33 and 34 are supplied to the soft input value calculation circuit 37.

The soft input value calculation circuit 37 sets the initial value one in the counter k at step ST41, and proceeds to step ST42. At step ST42, it multiplies the kth-bit $W_k$ of the reliability information by a constant as the following Expression (17), and proceeds to step ST43.

$$W_k \leftarrow \gamma \times W_k \qquad (17)$$

where $\gamma$ is the constant which is set appropriately in accordance with the number of times of iterations of the decoding and the characteristics of the communication channel.

At the next step ST43, if the hard decision value $V_k$ of the correction information is zero, the processing proceeds to step ST44, or else, it proceeds to step ST45.

At step ST44, the soft input value calculation circuit 37 sets the kth-bit $E_k$ of the error pattern at zero, and replaces the kth-bit $F_k$ of the soft input value by the sum $(Z_k+W_k)$ of the reliability information $Z_k$ of the demodulation data and the reliability information $W_k$ of the correction information as the following Expressions (18) and (19), and proceeds to step ST48. When the sum $(Z_k+W_k)$ exceeds n bits, it is placed at an appropriate value represented by n bits or less.

$$E_k \leftarrow 0 \qquad (18)$$

$$F_k \leftarrow Z_k + W_k \qquad (19)$$

At step ST45, the soft input value calculation circuit 37 compares the reliability information $Z_k$ of the demodulation data with the reliability information $W_k$ of the correction information, and if the former is greater than the latter $(Z_k > W_k)$, it places the kth-bit $E_k$ of the error pattern at zero, and replaces the soft input value $F_k$ by the difference $(Z_k - W_k)$ obtained by subtracting the reliability information $W_k$ of the correction information from the reliability information $Z_k$ of the demodulation data as indicated by the following Expressions (20) and (21) (step ST46).

$$E_k \leftarrow 0 \qquad (20)$$

$$F_k \leftarrow Z_k - W_k \qquad (21)$$

On the other hand, if the reliability information $Z_k$ of the demodulation data is equal to or less than the reliability information $W_k$ of the correction information, the soft input value calculation circuit 37 places the kth-bit $E_k$ of the error pattern at one, and replaces the soft input value $F_k$ by the difference $(W_k - Z_k)$ obtained by subtracting the reliability information $Z_k$ of the demodulation data from the reliability information $W_k$ of the correction information as indicated by the following Expressions (22) and (23) (step ST47), and proceeds to step ST48.

$$E_k \leftarrow 1 \qquad (22)$$

$$F_k \leftarrow W_k - Z_k \qquad (23)$$

At step ST48, the soft input value calculation circuit 37 makes a decision as to whether the value of the counter k is equal to or less than the code length N2 of the C2 code. If the counter k is less than N2, it increments the counter k at step ST49, and executes the processing from step ST42 and on iteratively. In contrast, if the value of the counter k equals N2, it completes the processing.

The error patterns $E_k$ (k=1, 2, ..., N2) computed by the soft input value calculation circuit 37 are stored into the error pattern memory 42, and are supplied to the adder 39.

The adder 39 adds (exclusively ORs) the error patterns $E_k$ and the hard decision values $Y_k$ of the demodulation data supplied from the input terminal 31 to generate the data sequence $X_k$ as the following Expression (24). The data sequence $X_k$ generated is supplied to the syndrome calculation circuit 40.

$$X_k \leftarrow Y_k + E_k \qquad (24)$$

The syndrome calculation circuit 40 computes the syndrome S of the data sequence $X_k$ by the following Expression (25).

$$S = H2 \times X \qquad (25)$$

where H2 is a parity check matrix of the C2 code as described above, and X is a column vector, the transpose of the row vector $(X_1, X_2, \ldots, X_{N2})$. The syndrome calculation circuit 40 supplies the syndrome S to the C2 codeword candidate generating circuit 43.

On the other hand, the soft input values $F_k$ (k=1, 2, ..., N2) computed by the soft input value calculation circuit 37 are stored in the soft input memory 41, and are supplied to the low reliability position detecting circuit 38.

The low reliability position detecting circuit 38 detects p least values among the soft input values $F_k$ (k=1, 2, ..., N2) in sequence, and notifies the C2 codeword candidate generating circuit 43 of the p positions. Let us assume here that p=3, and the positions are I1, I2 and I3.

The C2 codeword candidate generating circuit 43 computes modified syndromes S[k] (k=0, 1, ..., 7) from the syndromes S computed by the syndrome calculation circuit 40 and the positions I1, I2 and I3 detected by the low reliability position detecting circuit 38 as follows.

$S[0] \leftarrow S$
$S[1] \leftarrow S[0] + \beta^{I1}$
$S[2] \leftarrow S[0] + \beta^{I2}$
$S[3] \leftarrow S[1] + \beta^{I2}$
$S[4] \leftarrow S[0] + \beta^{I3}$
$S[5] \leftarrow S[1] + \beta^{I3}$
$S[6] \leftarrow S[2] + \beta^{I3}$
$S[7] \leftarrow S[3] + \beta^{I3}$ For the modified syndromes S[k] (k=0, 1, ..., 7), the error position sets are each determined as follows.

$E[0] = \Phi$
$E[1] = \{I1\}$
$E[2] = \{I2\}$
$E[3] = \{I1,I2\}$
$E[4] = \{I3\}$
$E[5] = \{I1,I3\}$
$E[6] = \{I2,I3\}$
$E[7] = \{I1,I2,I3\}$ where Φ designates an empty set.

The C2 codeword candidate generating circuit 43 computes error positions from the modified syndromes S[k] (k=0, 1, ..., 7) by carrying out an algebraic operation on a Galois field, or by looking up a table storing error positions for the syndromes. The error position of the modified syndrome S[k] is denoted by I[k]. When the error position I[k] is included in the error position set E[k], the I[k] is removed from the E[k], and when it is not included, the I[k] is added to the error position set E[k].

If the error position sets E[k1] and E[k2] for different k1 and k2 become identical by the addition and elimination of the error positions, one of them is discarded so that only different error position sets are considered. These error position sets are redefined as E[k] (k=1, 2, ..., K), where K is the number of different error position sets.

Subsequently, the C2 codeword candidate generating circuit 43 computes the correlation mismatch amounts CM[k] given by the following Expression (26) in accordance with the computed error position sets E[k] (k=1, 2, ..., K). The error position sets E[k] and the correlation mismatch amounts CM[k] are supplied to the soft output value calculation circuit 44.

$$CM[k] = \sum_{l \in E[k]} F_l \quad (26)$$

The soft output value calculation circuit 44 updates the error patterns and soft input values using the soft input values $F_k$ (k=1, 2, ..., N2) fed from the soft input memory 41, the error patterns $E_k$ (k=1, 2, ..., N2) fed from the error pattern memory 42, and the error position sets E[k] and correlation mismatch amounts CM[k] (k=0, 1, ..., K) fed from the C2 codeword candidate generating circuit 43.

Next, the operation of the soft output value calculation circuit 44 will be described in detail.

The soft output value calculation circuit 44 sets the initial value one in the counter i at step ST51, and proceeds to step ST52. Here, the counter i indicates the bit positions 1, 2, ..., N2 of the C2 code.

At step ST52, the soft output value calculation circuit 44 sets the initial value one in the counter k, and the initial value M in registers L0 and L1, followed by proceeding to step ST53, where M is a sufficiently large constant representable by the registers L0 and L1.

At step ST53, the soft output value calculation circuit 44 makes a decision as to whether the value of the counter i is included in the error position set E[k] or not. If the value of the counter i is included in the error position set E[k], the processing proceeds to step ST54, or else, to step ST55.

At step ST54, the soft output value calculation circuit 44 updates the register L0 according to the following Expression (27), and proceeds to step ST56.

$$L0 \leftarrow f(L0, CM[k]) \quad (27)$$

where f is a function defined by the following Expression (28).

$$f(X,Y) = \min(X,Y) - T(|X-Y|) \quad (28)$$

where "min(X,Y)" is a function for selecting a smaller one of the two values X and Y, and T is a function for returning an appropriate value to the absolute value |X-Y| of the difference between the values X and Y. If the function f becomes negative, it is adjusted appropriately such as replacing it by zero.

At step ST55, the soft output value calculation circuit 44 updates the register L1 according to the following Expression (29), and proceeds to step ST56.

$$L1 \leftarrow f(L1, CM[k]) \quad (29)$$

where the function f is the same function as defined by the foregoing Expression (28).

At step ST56, the soft output value calculation circuit 44 makes a decision as to whether the value of the counter k is less than K or not. If the value of the counter k is less than K, the processing proceeds to step ST57 to increment the value of the counter k, followed by iterating the processing from step ST53 and on. On the other hand, if the value of the counter k equals K, the processing proceeds to step ST58.

At step ST58, the soft output value calculation circuit 44 makes a decision as to whether the values of the registers L0 and L1 are each less than the constant M or not. If both the values of the registers L0 and L1 are less than the constant M, the processing proceeds to step ST59.

At step ST59, the soft output value calculation circuit 44 updates the soft input value $F_k$ according to the following Expression (30), and the processing proceeds to step ST60.

$$F_k \leftarrow L0 - L1 \quad (30)$$

At step ST60, the soft output value calculation circuit 44 makes a decision as to whether the soft input value $F_k$ is negative or not. If the soft input value $F_k$ is negative, the processing proceeds to step ST61, or else, to step ST65.

At step ST61, the soft output value calculation circuit 44 updates the error patterns $E_k$ and soft input values $F_k$ according to the following Expressions (31) and (32). The addition in Expression (31) is a modulo-2 addition, whereas that of Expression (32) is a common addition on integers.

$$E_k \leftarrow E_k + 1 \quad (31)$$

$$F_k \leftarrow -F_k + C1 \quad (32)$$

where C1 of Expression (32) is an appropriate constant.

If the soft output value calculation circuit 44 makes a decision that one of the registers L0 and L1 equals the constant M at step ST58, the processing proceeds to step ST62.

At step ST62, the soft output value calculation circuit 44 makes a decision as to whether the content of the register L0 is less than the constant M or not. If the value of the register L0 is less than the constant M, the processing proceeds to step ST63, or else to step ST64.

At step ST63, the soft output value calculation circuit 44 updates the error patterns $E_k$ and soft input values $F_k$ according to the following Expressions (33) and (34).

$$E_k \leftarrow E_k + 1 \quad (33)$$

$$F_k \leftarrow F_k + C2 \quad (34)$$

where C2 in Expression (34) is an appropriate constant.

At step ST64, on the other hand, the soft output value calculation circuit 44 updates the soft input values $F_k$ according to the following Expression (35).

$$F_k \leftarrow F_k + C3 \quad (35)$$

where C3 is an appropriate constant. In this case, the update of the error patterns $E_k$ is not carried out.

At step ST65, the soft output value calculation circuit 44 makes a decision as to whether the value of the counter i is less than N2 or not. If the value of the counter i is less than N2, the processing proceeds to step ST66 to increment the counter i, followed by iterating the processing from step ST52 and on. In contrast, if the value of the counter i is equal to N2, all the processing is completed.

Subsequently, the soft output value calculation circuit 44 updates the hard decision values $V_k$ and reliability information $W_k$ of the correction information according to the updated error patterns $E_k$ and soft input values $F_k$ (k=1, 2, ..., N2).

First, at step ST71, the soft output value calculation circuit 44 sets the initial value one in the counter k, and proceeds to step ST72.

At step ST72, the soft output value calculation circuit 44 assigns the error pattern $E_k$ to the hard decision value $V_k$ of the correction information. At step ST73, the soft output value calculation circuit 44 makes a decision as to whether the hard decision value $V_k$ is zero or not. If the hard decision value $V_k$ is zero, the processing proceeds to step ST74, or else to step ST77.

At step ST74, the soft output value calculation circuit 44 updates the reliability information $W_K$ of the correction information by the following Expression (36), and proceeds to step ST75.

$$W_k \leftarrow F_k + Z_k \quad (36)$$

At step ST75, the soft output value calculation circuit 44 makes a decision as to whether the reliability information $W_k$ of the correction information is greater than a constant C4 or not, where C4 is an appropriate constant represented within n bits. If the reliability information $W_k$ is greater than C4, the processing proceeds to step ST76, or else to step ST80. At step ST76, the soft output value calculation circuit 44 sets the reliability information $W_k$ at the constant C4, and the processing proceeds to step ST80.

On the other hand, at step ST77, the soft output value calculation circuit 44 updates the reliability information $W_k$ of the correction information by the following Expression (37), and proceeds to step ST78.

$$W_k \leftarrow F_k - Z_k \quad (37)$$

At step ST78, the soft output value calculation circuit 44 makes a decision as to whether the reliability information $W_k$ of the correction information is less than zero or not. If the reliability information $W_k$ is less than zero, the processing proceeds to step ST79, or else to step ST80. At step ST79, the soft output value calculation circuit 44 sets the reliability information $W_k$ at zero, and proceeds to step ST80.

At step ST80, the soft output value calculation circuit 44 makes a decision as to whether the value of the counter k is less than N2 or not. If the value of the counter k is less than N2, the processing proceeds, to step ST81 to increment the value of the counter k, followed by iterating the processing from step ST72 and on. On the other hand, if the value of the counter k is equal to N2, the soft output value calculation circuit 44 completes all its processing.

The hard decision values $V_k$ (k=1, 2, ..., N2) of the correction information updated by the soft output value calculation circuit 44 are output from the output terminal 47 sequentially from k=1 to be used as the hard decision values of the correction information for the C1 code decoding. In parallel with the hard decision values, the updated reliability information $W_k$ (k=1, 2, ..., N2) of the correction information is output from the output terminal 48 to be used as the reliability information of the correction information for the C1 code decoding. The total of (1+n) bits of each hard decision value and reliability information of the correction information are supplied to the multiplexer 23.

Furthermore, in parallel with the output of the correction information (hard decision value and reliability information), the hard decision memory 35 and reliability information memory 36 output the hard decision value and reliability information of the demodulation data. The total of (1+m) bits of the hard decision value and reliability information of the demodulation data are supplied to the multiplexer 23.

The multiplexer 23 multiplexes the N1×(1+m) demodulation data and N1×(1+n) correction information, which are output from the N1 soft input/soft output decoders 22A, 22B and 22C of the C2 code at individual time points, and supplies its output to the soft input/soft output decoder 24 of the C1 code.

Figure 4:
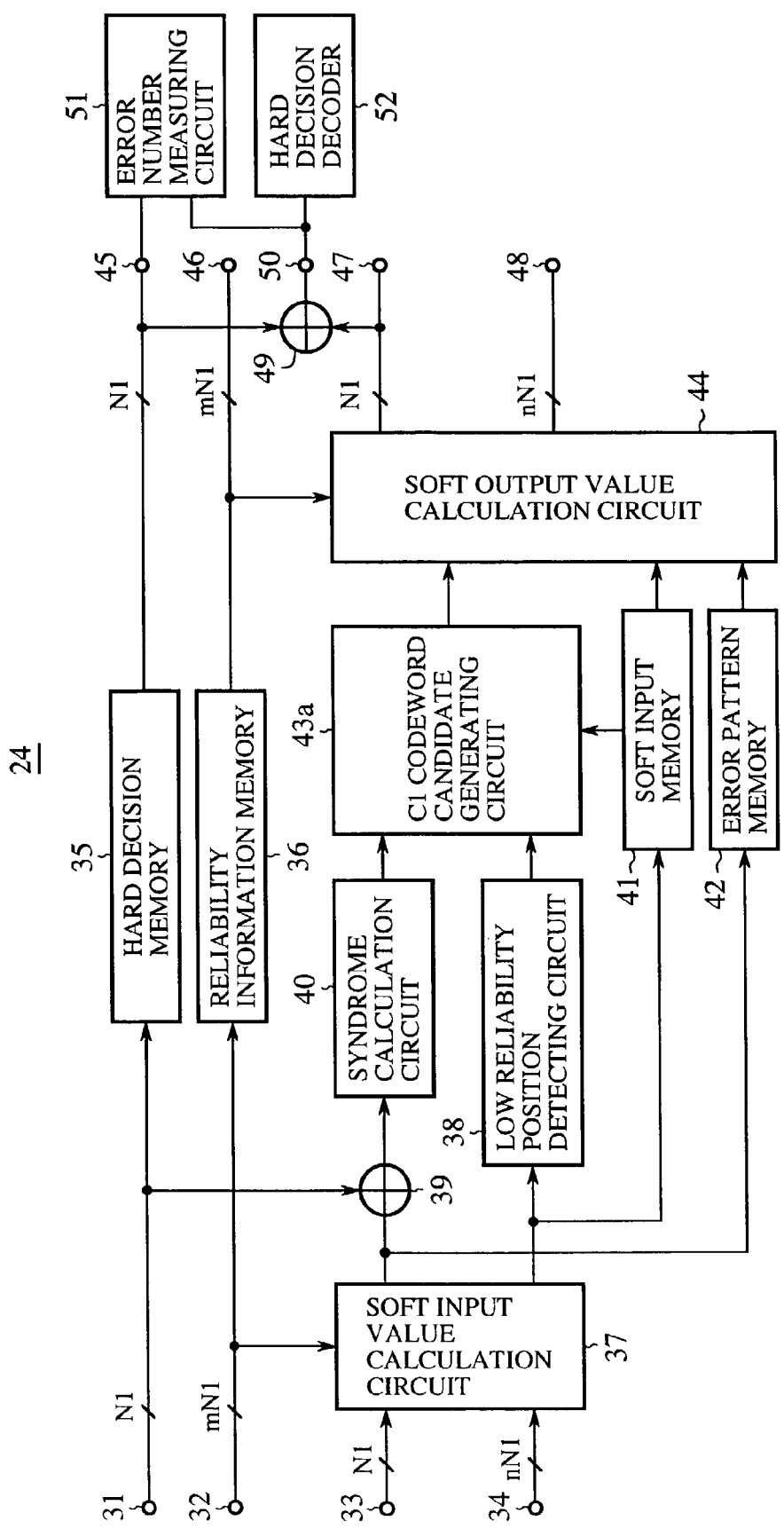
FIG. 4 is a block diagram showing a configuration of a soft input/soft output decoder of C2 code.

FIG. 4 is a block diagram showing a configuration of the soft input/soft output decoder 24 of the C1 code. In FIG. 4, the same or like portions to those of FIG. 3 are designated by the same reference numerals, and the description thereof is omitted here.

In FIG. 4, the reference numeral 43a designates a C1 codeword candidate generating circuit for generating a C1 codeword candidate in the same manner as the C2 codeword candidate generating circuit 43; 49 designates an adder for adding (exclusively ORing) the hard decision value of the demodulation data fed from the hard decision memory 35 and the hard decision value of the correction information fed from the soft output value calculation circuit 44 to generate the decoded data; and 50 designates an output terminal for outputting the decoded data generated by the adder 49. The reference numeral 51 designates an error number measuring circuit for measuring the number of errors by comparing the hard decision values of the demodulation data and the decoded data; and 52 designates a hard decision decoder for further carrying out the hard decision decoding of the C1 code.

The soft input/soft output decoder 24 of the C1 code operates in the same manner as the soft input/soft output decoders 22A, 22B and 22C of the C2 code except that the soft input/soft output decoder 24 of the C1 code processes the code with the code length N1 as a single unit. Thus, the input terminal 31 is supplied with the N1-bit hard decision values of the demodulation data in parallel, and the input terminal 32 is supplied with the m×N1-bit reliability information of the demodulation data in parallel. Likewise, the input terminal 33 is supplied with the N1-bit hard decision values of the correction information in parallel, and the input terminal 34 is supplied with the n×N1-bit reliability information of the correction information in parallel.

The soft input value calculation circuit 37 carries out the processing as illustrated in FIG. 5 in parallel in terms of the counter k, so that the error patterns $E_k$ and soft input values $F_k$ (k=1, 2, ..., N1) are calculated simultaneously. The soft input values $F_k$ calculated are supplied to the low reliability position detecting circuit 38, and stored in the soft input memory 41. The error patterns $E_k$ are supplied to the adder 39, and stored in the error pattern memory 42.

The adder 39 adds the N1-bit hard decision values of the demodulation data fed from the input terminal 31 and the N1-bit error patterns fed from the soft input value calculation circuit 37 bit by bit in the same manner as the foregoing Expression (24), thereby generating N1-bit data sequences $X_1, X_2, \ldots, X_{N1}$. The data sequence are supplied to the syndrome calculation circuit 40.

The syndrome calculation circuit 40 computes the syndromes S of the data sequence $X_k$ (k=1, 2, ..., N1) by the following Expression (38).

$$S = H1 \times X \quad (38)$$

where H1 is a parity check matrix of the C1 code defined by the foregoing Expression (15), and X is a column vector, the transpose of the row vector $(X_1, X_2, \ldots, X_{N1})$. The syndromes S computed by the syndrome calculation circuit 40 are supplied to the C1 codeword candidate generating circuit 43a.

The low reliability position detecting circuit 38 detects p least values among the soft input value $F_k$ (k=1, 2, ..., N1) in parallel, and notifies the C1 codeword candidate generating circuit 43a of the p positions. Let us assume in the following description that p=3 as with the soft input/soft output decoder of the C2 code.

The C1 codeword candidate generating circuit 43a computes modified syndromes S[k] and error position sets E[k] (k=0, 1, ..., 7) from the syndromes S computed by the syndrome calculation circuit 40 and the p positions detected by the low reliability position detecting circuit 38 in the same manner as the C2 codeword candidate generating circuit 43.

The C1 codeword candidate generating circuit 43a computes the error positions from the modified syndromes S[k] (k=0, 1, ..., 7) by carrying out an algebraic operation on the Galois field, or by looking up the table in the same manner as in the C2 code decoding. Thus, the error position sets E[k] are redefined. The error position sets that differ from each other after the redefinition are represented by E[k] (k=1, 2, ..., K), where K is the total number of the different error position sets.

Subsequently, the C1 codeword candidate generating circuit 43a computes the correlation mismatch amounts CM[k] corresponding to the error position sets E[k] (k=1, 2, ..., K) using the foregoing Expression (26). The error position sets E[k] and the correlation mismatch amounts CM[k] (k=1, 2, ..., K) are supplied to the soft output value calculation circuit 44.

The soft output value calculation circuit 44 updates the error patterns and soft input values as in the flowchart of FIG. 6 using the soft input values $F_k$ (k=1, 2, ..., N1) fed from the soft input memory 41, the error patterns $E_k$ (k=1, 2, ..., N1) fed from the error pattern memory 42, and the error position sets E[k] and correlation mismatch amounts CM[k] (k=0, 1, ..., K) fed from the C1 codeword candidate generating circuit 43a. In the C1 code decoding, however, the flow of FIG. 6 is developed in parallel in terms of the counter i in order to update the error patterns $E_k$ and soft input values $F_k$ of the individual bits simultaneously.

Subsequently, the soft output value calculation circuit 44 updates the correction information (hard decision values $V_k$ and reliability information $W_k$) using the error patterns $E_k$ and soft input values $F_k$ in the same manner as the flowchart of FIG. 7. In the C1 code decoding, however, the flow of FIG. 7 is developed in parallel in terms of the counter k in order to update the correction information (hard decision values $V_k$ and reliability information $W_k$) of the individual bits simultaneously.

The N1-bit hard decision values of the correction information updated by the soft output value calculation circuit 44 are supplied to the adder 49 in parallel. At the same time, they are output from the output terminal 47 in parallel as the hard decision values of the correction information of the next iterative element decoder. In addition, the n×N1-bit reliability information is output from the output terminal 48 in parallel as the reliability information corresponding to the hard decision values. The total of (1+n)N1 bits of the hard decision values and reliability information of the correction information are output simultaneously from the output terminal D of the iterative element decoder.

In addition, in parallel with the output of the correction information, the hard decision memory 35 and reliability information memory 36 output the hard decision values of the demodulation data and reliability information. The N1-bit hard decision values of the demodulation data are supplied in parallel to the adder 49, and are output in parallel from the output terminal 45. The m×N1-bit reliability information is output in parallel from the output terminal 46. The total of (1+m)N1 bits of the hard decision values and reliability information of the demodulation data are output from the output terminal C of the iterative element decoder simultaneously.

The adder 49 adds (exclusively ORs) the N1-bit hard decision values of the demodulation data fed from the hard decision memory 35 and the N1-bit hard decision values of the correction information fed from the soft output value calculation circuit 44, thereby generating the N1-bit decoded data of the product code column by column. The decoded data generated is output in parallel from the output terminal 50 which corresponds to the output terminal E of the iterative element decoder (see, FIG. 1).

The (1+m)N1-bit demodulation data output from the output terminal C of the iterative element decoder is supplied to the input terminal A of the next iterative element decoder. Likewise, the (1+n)N1-bit correction information output from the output terminal D is supplied to the input terminal B of the next iterative element decoder. The output terminal C and output terminal D of the final iterative element decoder are open, so that only the decoded data is output column by column from its output terminal E.

As described above, the present embodiment 1 is configured such that it generates the error position sets of the data sequence by generating the codewords from the positions of soft input values output from the low reliability position detecting circuit 38 and the syndromes computed by the syndrome calculation circuit 40, and that it includes the codeword candidate generating circuit for computing the correlation mismatch amounts by adding the error position sets of the data sequence and the soft input values at the error positions contained in the error position sets, and updates the correction information according to the error position sets and correlation mismatch amounts. As a result, the present embodiment 1 offers an advantage of being able to calculate the soft output values accurately by utilizing the generated codeword candidates efficiently, and to reduce the circuit scale by decreasing the amount of computation.

Thus, the decoding apparatus of a product code of the present embodiment 1 is suitable for the case where the demodulation data is represented by the hard decision values and the reliability information. As for the calculation of the likelihood, the present embodiment 1 uses the correlation mismatch amount instead of the squared Euclidean distance, which offers an advantage of being able to reduce the amount of calculation. In particular, considering the circuit scale of the two cases, although the bit width W1 of the squared Euclidean distance is evaluated by the following Expression (39), where N equals N1 or N2, the bit width W2 of the correlation mismatch amount of the present embodiment 1 is given by the following Expression (40). Accordingly, when the value p is less than N, the bit width can be reduced.

$$W_1 = n + \lceil \log_2(N) \rceil \tag{39}$$

$$W_2 = n + \lceil \log_2(p+1) \rceil \tag{40}$$

Although the present embodiment 1 employs the Hamming code as the C1 code and C2 code, it is obvious that it can use other codes such as BCH code and Reed-Muller code.

In addition, although the present embodiment 1 handles the decoding apparatus including multiple iterative element decoders connected in cascade, this is not essential. For example, it is possible to carry out cyclic decoding by supplying the demodulation data output from the output terminal C of the iterative element decoder to the input terminal A of the same iterative element decoder, and by supplying the correction information output from the output terminal D to the input terminal B of the same iterative element decoder. This configuration can sharply reduce the circuit scale.

When the number of the positions with the low reliability is large, which are detected by the low reliability position detecting circuit 38, the present embodiment 1 has a problem of having an enormous total number of the modified syndromes and error position sets, which are set by the codeword candidate generating circuit. In this case, the problem can be eliminated by selecting the error position sets with the least element number previously.

When the present embodiment 1 includes the error number measuring circuit 51 (FIG. 4) for measuring the number of errors by comparing the hard decision values of the demodulation data with the decoded data, it can monitor the state of the communication channel.

Although the present embodiment 1 assumes that the demodulation data consists of the hard decision values and the reliability information, this is not essential. For example, when the demodulation data consists of only the hard decision values, the decoding method and decoding apparatus in accordance with the present invention is applicable by setting the reliability information appropriately.

Figure 8:
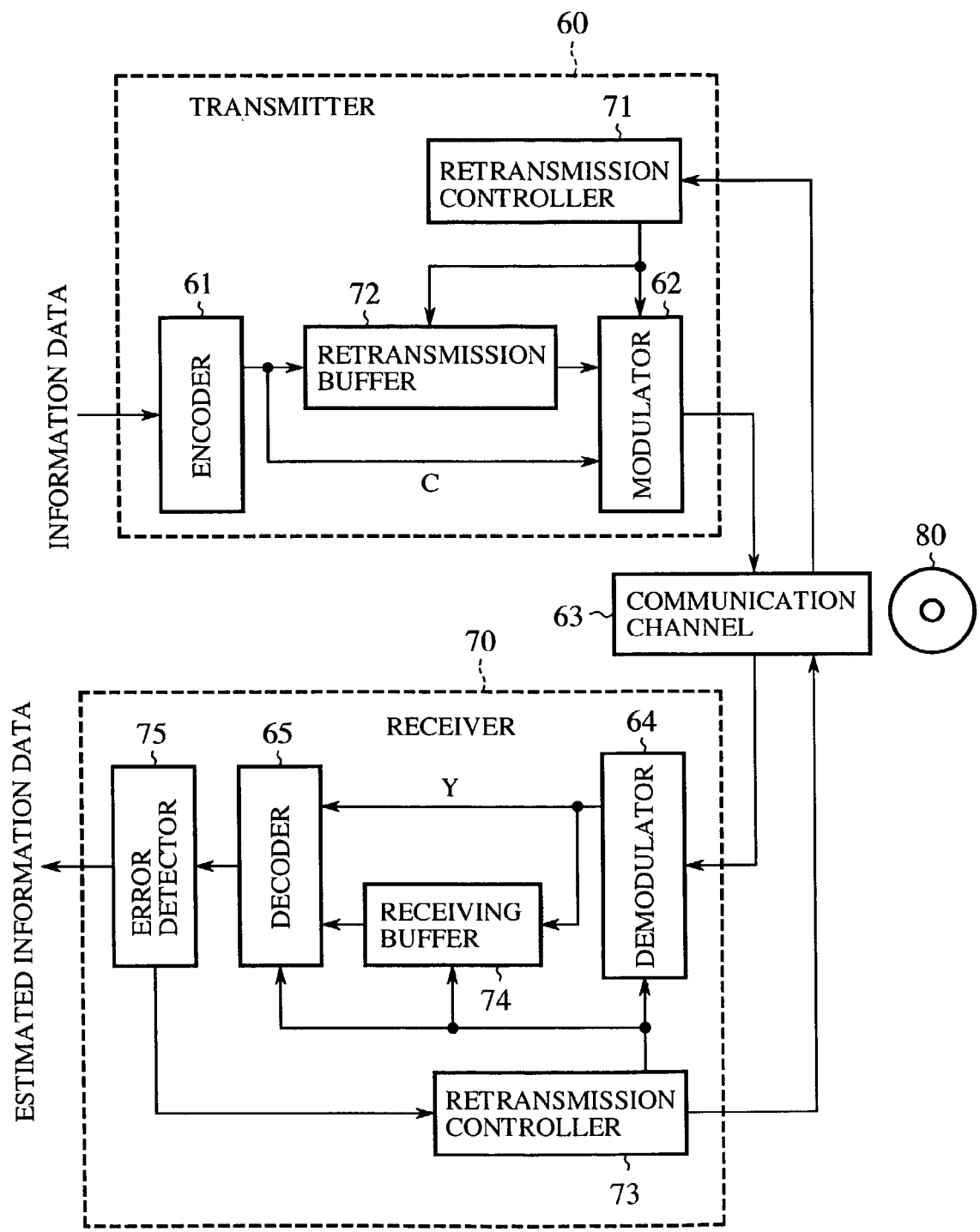
FIG. 8 is a block diagram showing a configuration of a digital transmission system of an embodiment 3 in accordance with the present invention.
Figure 9:
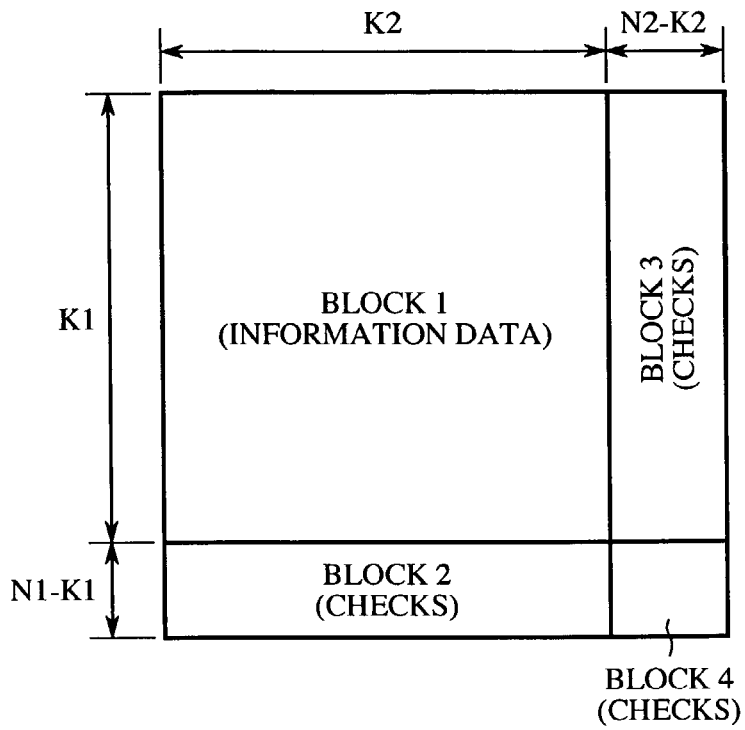
FIG. 9 is a diagram showing a construction of a product code.
Figure 10:
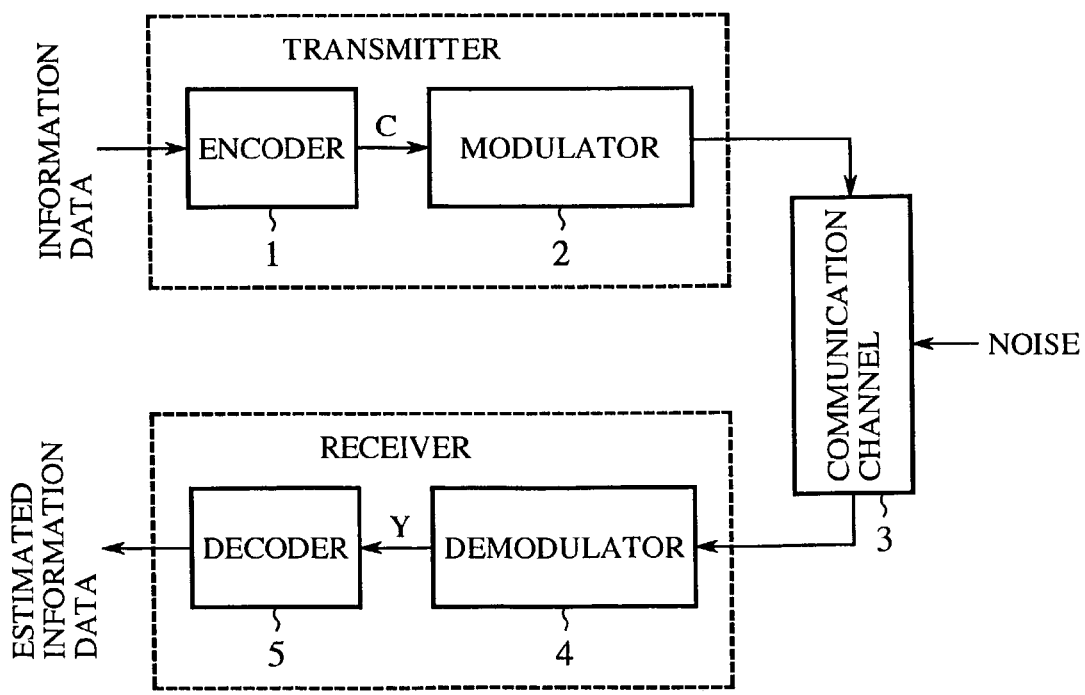
FIG. 10 is a block diagram showing a configuration of a conventional digital transmission system.
Figure 11:
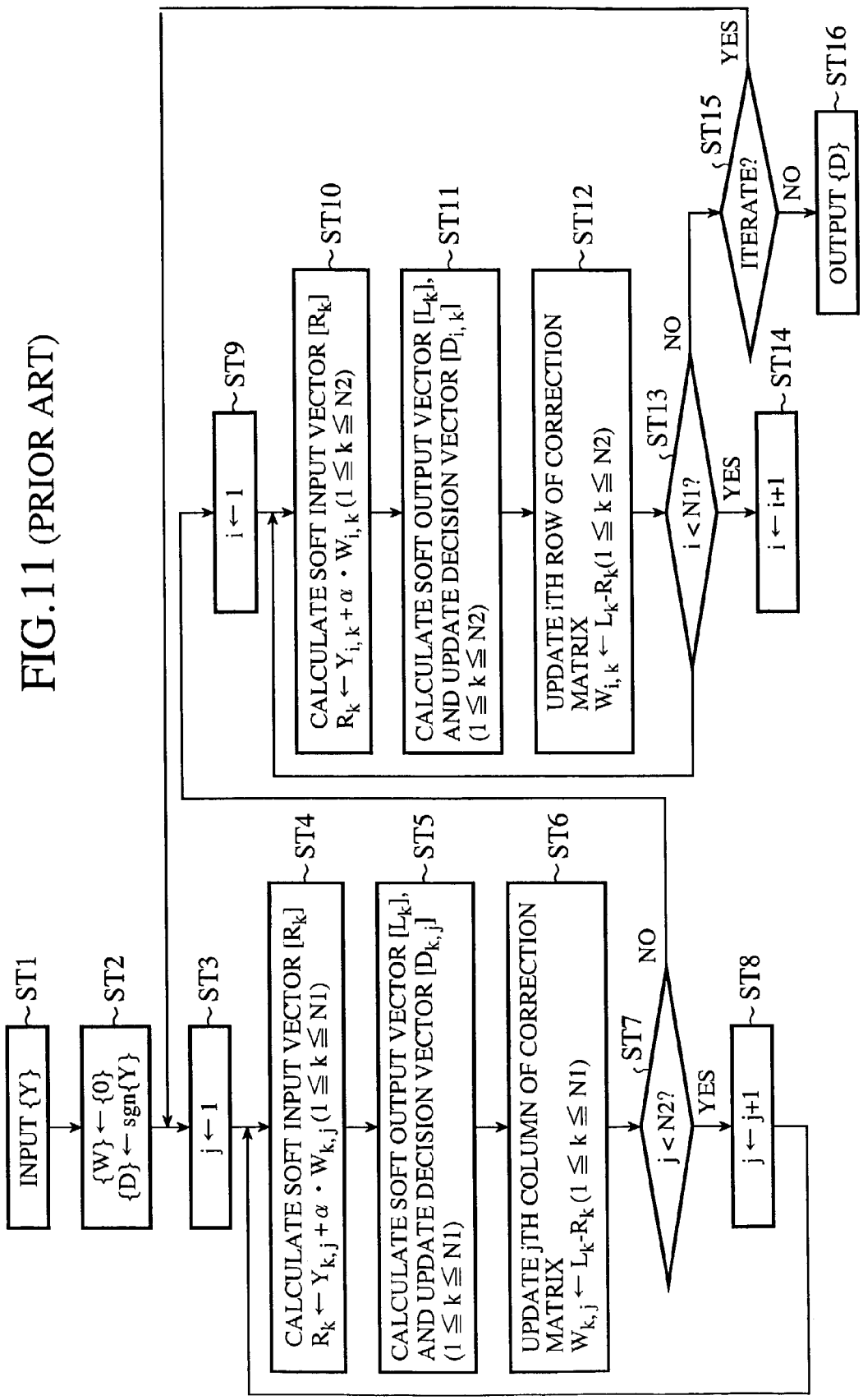
FIG. 11 is a flowchart illustrating the operation of the decoder of FIG. 10.
Figure 12:
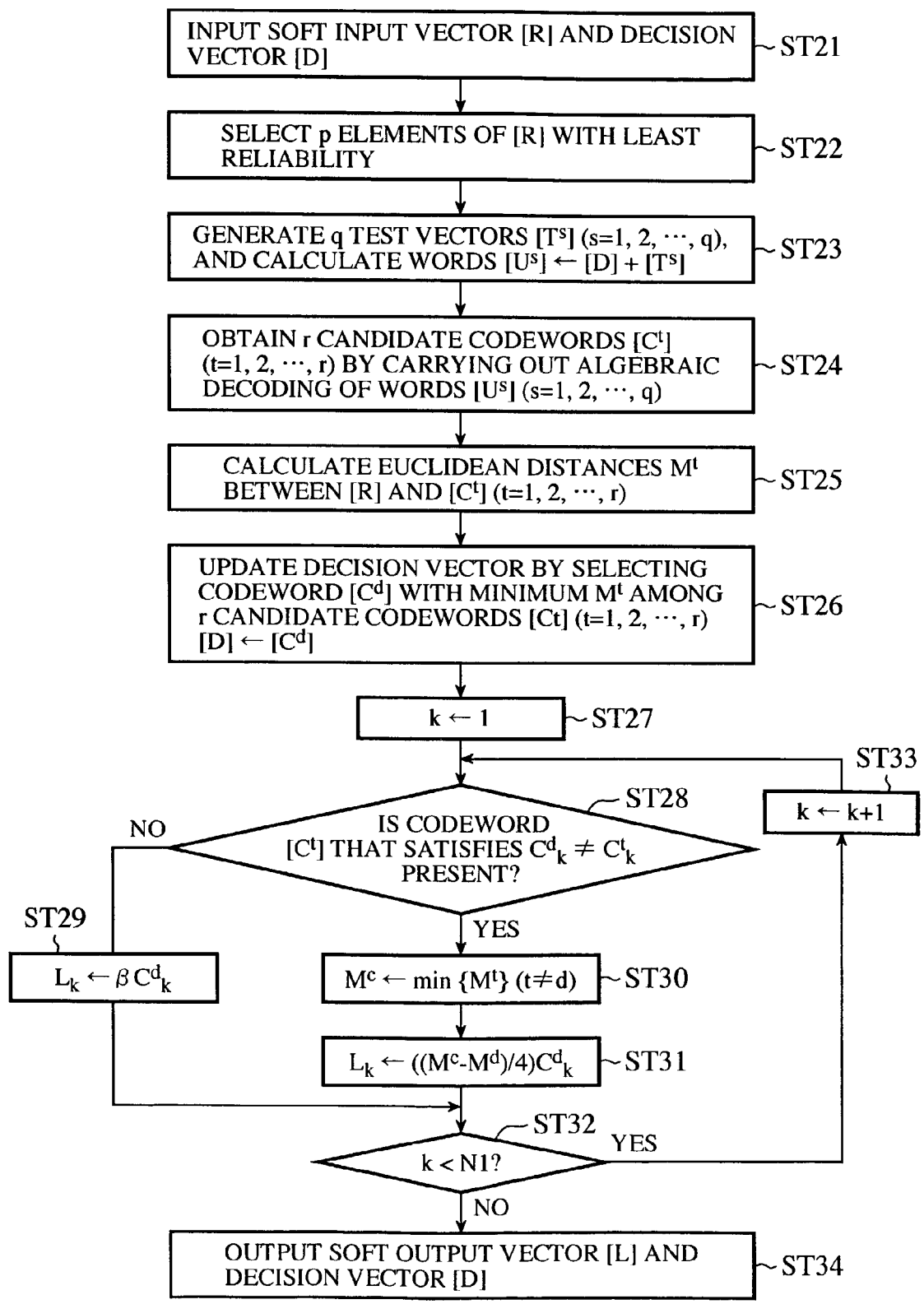
FIG. 12 is a flowchart illustrating the details of the step ST5 of FIG. 11.

The decoding apparatus of a product code of the present embodiment 1 is suitable for establishing high quality digital transmission. Thus, connecting an encoding apparatus of a product code with the decoding apparatus via a transmission medium can implement a high performance digital transmission system. The transmission medium is not limited to a radio or optical fiber channel, but may be a recording medium such as an optical disk 80 as shown in FIG. 8.

Embodiment 2

The binary linear code constituting the product code, the C1 code and C2 code, is an error detection code as well as an error correction code. In particular, the error detection has an advantage of being implemented easily by computing the syndromes. Utilizing the advantage, the error detection of the product code can be achieved easily by installing a syndrome calculation circuit for the C1 code or C2 code after the decoding apparatus of a product code described in the foregoing embodiment 1.

In this case, if all the syndromes of the element codes are zero, a decision is made that no error occurs, that is, the decoded data output from the decoding apparatus is correct. In contrast, if any element code includes the syndromes of nonzero, a decision is made that the decoded data is incorrect. In the case where the error is detected, it is better to discard the decoded data and to halt the operation at the error detection.

Employing the soft input/soft output decoding using the soft decision, the decoding apparatus of a product code of the foregoing embodiment 1 does not assure that the individual elements of the decoded data satisfy the parity check matrices given by the foregoing Expressions (15) and (16).

Accordingly, detecting the error by computing the syndromes of the C1 code or C2 code can improve the reliability of the decoded data. Furthermore, installing the hard decision decoder 52 of the C1 code or C2 code as shown in FIG. 4 instead of the syndrome calculation circuit (error detecting circuit) to further make the hard decision decoding of the decoded data, offers an advantage of being able to improve the reliability with enabling the error detection at the same time.

Embodiment 3

FIG. 8 is a block diagram showing a configuration of a digital transmission system of an embodiment 3 in accordance with the present invention. In FIG. 8, the reference numeral 60 designates a transmitter; 61 designates an encoder for generating a product code by encoding the input information data; 62 designates a modulator for converting the product code generated by the encoder 61 to a signal suitable for a communication channel 63; 63 designates the communication channel; 64 designates a demodulator for demodulating the received signal fed from the communication channel 63 and supplies the demodulation data to a decoder 65; 65 designates the decoder for decoding the demodulation data fed from the demodulator 64 to estimate the information data; 70 designates a receiver; 71 designates a retransmission controller; 72 designates a retransmission buffer; 73 designates a retransmission controller; 74 designates a receiving buffer; and 75 designates an error detector. The encoder 61, retransmission buffer 72, modulator 62 and retransmission controller 71 constitute the transmitter 60, and the demodulator 64, receiving buffer 74, decoder 65, error detector 75 and retransmission controller 73 constitute the receiver 70. Incidentally, the reference numeral 80 designates a recording medium such as an optical disk usable as a transmission medium instead of the communication channel 63 as described above.

The operation of the digital transmission system of FIG. 8 will be described using a product code composed of a binary linear code C1 with code length N1 and information length K1 and a binary linear code C2 with code length N2 and information length K2.

First, receiving the K1×K2-bit information data, the encoder 61 generates the product code C given by the foregoing Expression (2). The product code C generated by the encoder 61 is stored in the retransmission buffer 72 and supplied to the modulator 62 which converts it to a signal suitable for the communication channel 63, and supplies it to the communication channel 63.

The signal transmitted via the communication channel 63 is supplied to the demodulator 64 of the receiver. The demodulator 64 generates the demodulation data Y given by the foregoing Expression (3) by shaping the received signal.

The demodulation data Y is stored in the receiving buffer 74, and supplied to the decoder 65. The decoder 65 estimates the information data by the iterative decoding described in the foregoing embodiment 1, and supplies the decoding result to the error detector 75.

The error detector 75 detects an error by computing the syndromes of the element code (C1 code or C2 code). Then, it makes a decision that no error occurs if all the syndromes of the element code are zero, or else that the error occurs.

When the error detector 75 makes a decision that no error occurs, the decoding result is supplied to a host side not shown in the drawings. In contrast, if the error detector 75 detects an error, it notifies the retransmission controller 73 of the fact that the decoding result includes an error. Receiving the notification of the error detection, the retransmission controller 73 sends the retransmission request to the transmitter.

Receiving the retransmission request, the transmitter 60 supplies the modulator 62 again with the product code C stored in the retransmission buffer 72 to be transmitted via the communication channel 63. In the receiver 70, the demodulator 64 demodulates the retransmission signal to generate the demodulation data Y'.

The demodulation data Y', which is represented by an N1×N2 matrix as indicated by the foregoing Expression (3), is supplied to the decoder 65. In addition, the previous demodulation data Y stored in the receiving buffer 74 is also supplied to the decoder 65.

The decoder 65 combines the demodulation data Y' fed from the demodulator 64 with the previous demodulation data Y fed from the receiving buffer 74 by a diversity combiner not shown in the drawing, to conduct the decoding again, and supplies the decoding result to the error detector 75 again.

If the error detector 75 detects an error in the decoding result within a time period assigned to the decoding of the current receiving data, the retransmission controller 73 sends the retransmission request to the transmitter again. In contrast, when the time is over, the retransmission controller 73 abandons the decoding, and starts the next processing of the receiving data.

With the foregoing configuration, the digital transmission system of the present embodiment 3 can implement a highly reliable digital transmission system using the product codes. Although it is assumed in the foregoing example that if the error is detected, all the codewords of the product code are retransmitted, this is not essential. For example, retransmitting only the element code in which the error is 0detected can improve the throughput markedly. In addition, installing the receiving buffer 74 enables the combining of the retransmission data with the previous receiving data. Thus, it can improve the decoding performance greatly because of the diversity effect.

The invention claimed is:

1. A decoding method comprising:
  a soft input value calculation step of calculating error patterns and soft input values from reliability information constituting demodulation data and from correction information;
  a detection step of detecting, when the soft input value calculation step computes the soft input values, a predetermined number of soft input values with least values sequentially;
  a syndrome calculation step of adding the error patterns computed by the soft input value calculation step and hard decision values constituting the demodulation data to generate a data sequence, and of calculating syndromes of the data sequence;
  a codeword generating step of generating a codeword from positions of the soft input values detected by the detection step and the syndromes computed by the syndrome calculation step to generate error position sets of the data sequence, and of calculating correlation mismatch amounts by adding the soft input values at the error positions included in the error position sets;
  an update step of updating the correction information in accordance with the error position sets and the correlation mismatch amounts; and
  a decoding step of decoding a binary linear code from the correction information updated by the update step and the demodulation data.

2. The decoding method according to claim 1, wherein the codeword generating step selects the error position sets with giving higher priority to the error position sets with a smaller number of elements, and supplies them to the update step.

3. The decoding method according to claim 1, wherein the update step comprising the steps of:
  selecting an error position set with a least correlation mismatch amount by sequentially comparing the correlation mismatch amounts corresponding to the error position sets including the positions of the binary linear code, and computing a first correlation mismatch amount by adding a correction value to the error position set;
  selecting an error position set with a least correlation mismatch amount by sequentially comparing the correlation mismatch amounts corresponding to the error position sets without including the positions of the binary linear code, and computing a second correlation mismatch amount by adding a correction value to the error position set; and
  calculating likelihood by subtracting the second correlation mismatch amount from the first correlation mismatch amount, and updating the correction information in accordance with the likelihood.

4. The decoding method according to claim 1, wherein when the updated correction information is composed of hard decision values indicating a correction flag, the decoding step generates decoded data of the binary linear code by adding the hard decision values of the correction information and the hard decision values of the demodulation data.

5. A decoding apparatus comprising:
  a demultiplexer for demultiplexing demodulation data and correction information into N1 C2 code demodulation data and N1 C2 code correction information, where N1 is a positive integer;
  N1 C2 code decoders for receiving the N1 C2 code demodulation data and the N1 C2 code correction information demultiplexed by said demultiplexer, for updating the correction information by carrying out soft input/soft output decoding of the C2 code, and for outputting updated correction information and the demodulation data;
  a multiplexer for multiplexing the correction information and the demodulation data output from said N1 C2 code decoders; and
  a C1 code decoder for receiving the correction information and demodulation data multiplexed by said multiplexing means, for updating the correction information by carrying out soft input/soft output decoding of the C1 code, and for decoding a binary linear code from the updated correction information and the demodulation data.

6. The decoding apparatus according to claim 5, wherein said C1 code decoder comprises:
  a soft input value calculation circuit for calculating error patterns and soft input values from reliability information constituting the demodulation data and from the correction information;
  a low reliability position detecting circuit for detecting, when said soft input value calculation circuit computes the soft input values, a predetermined number of soft input values with least values sequentially, and for outputting positions of the soft input values;

an adder for adding the error patterns computed by said soft input value calculation circuit and hard decision values constituting the demodulation data to generate a data sequence;

a syndrome calculation circuit for calculating syndromes of the data sequence generated by said adder;

a codeword generating circuit for generating error position sets of the data sequence by generating a codeword from the positions of the soft input values output from said low reliability position detecting circuit and from the syndromes computed by said syndrome calculation circuit, and for adding the soft input values at the error positions included in the error position sets of the data sequence to compute the correlation mismatch amounts;

a soft output value calculation circuit for calculating the correction information from the error position sets and the correlation mismatch amounts; and a decoding circuit for decoding a binary linear code from the correction information updated by said soft output value calculation circuit and the demodulation data.

7. The decoding apparatus according to claim 6, wherein when the updated correction information is composed of hard decision values indicating a correction flag, said decoding circuit generates decoded data of the binary linear code by adding the hard decision values of the correction information and the hard decision values of the demodulation data.

8. The decoding apparatus according to claim 5, wherein said C1 code decoding means supplies said demultiplexer with the updated correction information and the demodulation data to carry out cyclic decoding.

9. The decoding apparatus according to claim 5, wherein said C1 code decoder supplies the updated correction information and the demodulation data to a next stage decoding apparatus that has the same configuration as said decoding apparatus and is connected in cascade with said decoding apparatus.

10. The decoding apparatus according to claim 5, further comprising an error number measuring circuit for measuring a number of errors by comparing the decoded data output from said C1 code decoding means with hard decision values of the demodulation data.

11. The decoding apparatus according to claim 5, further comprising a hard decision decoding circuit for performing C1 code/C2 code hard decision decoding of the decoded data output from said C1 code decoding means.

12. The decoding apparatus according to claim 5, further comprising an error detecting circuit for computing syndromes of at least one of the C1 code and C2 code as to the decoded data output from said C1 code decoder, and for detecting an error of the decoded data from the syndromes.

13. A digital transmission system having a transmitter and a receiver, said transmitter including an encoder for converting information data to a product code including a C1 code and C2 code, and a modulator for modulating the product code output from said encoder, and said receiver including a demodulator connected to said transmitter via a transmission medium for demodulating the product code modulated by said modulator of said transmitter, and a decoding apparatus for decoding the product code demodulated by said demodulator, said decoding apparatus of said digital transmission system comprising:

a demultiplexer for demultiplexing demodulation data and correction information output from said demodulator into N1 C2 code demodulation data and N1 C2 code correction information, where N1 is a positive integer;

N1 C2 code decoders for receiving the N1 C2 code demodulation data and the N1 C2 code correction information demultiplexed by said demultiplexer, for updating the correction information by carrying out soft input/soft output decoding of the C2 code, and for outputting updated correction information and the demodulation data;

a multiplexer for multiplexing the correction information and the demodulation data output from said N1 C2 code decoders; and a C1 code decoder for receiving the correction information and demodulation data multiplexed by said multiplexing means, for updating the correction information by carrying out soft input/soft output decoding of the C1 code, and for decoding a binary linear code from the updated correction information and the demodulation data.

14. The digital transmission system according to claim 13, wherein said transmission medium is a recording medium.

15. The digital transmission system according to claim 13, further comprising an error detector for computing syndromes of at least one of the C1 code and C2 code as to the decoded data output from said C1 code decoder, and retransmission request device for sending to said transmitter a retransmission request of the modulation signal if said error detector detects an error of the decoded data in response to the syndromes.

16. The digital transmission system according to claim 15, further comprising a combiner for carrying out diversity combining of the demodulation data output from said demodulator before the retransmission request with the demodulation data output from said demodulator after the retransmission request.

* * * * *